(12) United States Patent
Asnaashari

(10) Patent No.: US 11,270,767 B2
(45) Date of Patent: Mar. 8, 2022

(54) NON-VOLATILE MEMORY BANK WITH EMBEDDED INLINE COMPUTING LOGIC

(71) Applicant: Crossbar, Inc., Santa Clara, CA (US)

(72) Inventor: Mehdi Asnaashari, Danville, CA (US)

(73) Assignee: Crossbar, Inc., Santa Clara, CA (US)

(*) Notice: Subject to any disclaimer, the term of this patent is extended or adjusted under 35 U.S.C. 154(b) by 0 days.

(21) Appl. No.: 16/428,173

(22) Filed: May 31, 2019

(65) Prior Publication Data
US 2020/0381047 A1 Dec. 3, 2020

(51) Int. Cl.
*G11C 7/10* (2006.01)
*G11C 13/00* (2006.01)

(52) U.S. Cl.
CPC .......... *G11C 13/0023* (2013.01); *G11C 7/109* (2013.01); *G11C 7/1057* (2013.01); *G11C 7/1063* (2013.01); *G11C 7/1069* (2013.01); *G11C 7/1084* (2013.01); *G11C 7/1096* (2013.01); *G11C 13/004* (2013.01); *G11C 13/0069* (2013.01); *G11C 13/0097* (2013.01)

(58) Field of Classification Search
CPC .. G11C 13/0023; G11C 7/1057; G11C 7/1069
USPC .................................................. 365/189.05
See application file for complete search history.

(56) References Cited

U.S. PATENT DOCUMENTS

| | | | |
|---|---|---|---|
| 7,095,642 B1 | 8/2006 | Parent et al. | |
| 9,524,210 B1 | 12/2016 | Asnaashari | |
| 2012/0030396 A1 | 2/2012 | Zhu et al. | |
| 2013/0132685 A1 | 5/2013 | Vogelsang et al. | |
| 2014/0071761 A1* | 3/2014 | Sharon ............... | G11C 11/5642 365/185.18 |
| 2014/0133211 A1 | 5/2014 | Nazarian et al. | |
| 2014/0293674 A1 | 10/2014 | Johnson | |

(Continued)

FOREIGN PATENT DOCUMENTS

WO   2017131792   8/2017

OTHER PUBLICATIONS

Examination Report for corresponding Taiwanese Patent Application No. 107134397 dated Oct. 7, 2019, 18 pages long.

(Continued)

*Primary Examiner* — Anthan Tran
(74) *Attorney, Agent, or Firm* — Wegman Hessler

(57) ABSTRACT

A non-volatile memory device having processing logic embedded within a memory bank of the non-volatile memory device is disclosed herein. By way of example, commands for controlling the processing logic can be exposed to a host device, enabling the host device to activate processing capacity of the memory bank in conjunction with a memory operation. The processing capacity can be directed by a data command, transmitted by the host device, at read or write data identified by the memory operation. Read data can be processed by the memory bank before being output onto a data interface connected to the memory bank. Likewise, write data received at the memory bank can be processed in conjunction with storing the write data in the non-volatile memory device. A disclose memory device can therefore implement internal processing in conjunction with reading or writing data to a memory device comprising respective banks of two-terminal non-volatile memory.

20 Claims, 15 Drawing Sheets

(56) References Cited

U.S. PATENT DOCUMENTS

| | | | |
|---|---|---|---|
| 2015/0003156 A1* | 1/2015 | Berckmann | G11C 29/04 |
| | | | 365/185.09 |
| 2015/0009745 A1 | 1/2015 | Nguyen et al. | |
| 2016/0189775 A1 | 6/2016 | Buchanan | |
| 2016/0260775 A1 | 9/2016 | Takaki | |
| 2016/0359916 A1* | 12/2016 | Kim | H04L 63/123 |
| 2017/0032839 A1 | 2/2017 | Bertin et al. | |
| 2019/0206460 A1* | 7/2019 | O | G11C 7/065 |

OTHER PUBLICATIONS

Notice of Allowance for corresponding U.S. Appl. No. 16/368,156 dated Mar. 26, 2020 9 pages long.

Notice of Allowance for corresponding U.S. Appl. No. 16/144,771 dated Feb. 20, 2020 8 pages long.

Notification of International Preliminary Report on Patentability for corresponding International Patent Application No. PCT/US2018/053544 dated Jan. 17, 2020, 18 pages long.

International Search Report and Written Opinion for corresponding International Patent Application No. PCT/US2018/053544 dated Dec. 4, 2018, 12 pages long.

Notice of Allowance for corresponding Taiwan Patent Application No. 107134397 dated May 13, 2020, 4 pages long.

* cited by examiner

NON-VOLATILE MEMORY BANK WITH EMBEDDED INLINE COMPUTING LOGIC

TECHNICAL FIELD

This disclosure relates generally to electronic memory; as one example, the disclosure describes an electronic memory comprising a computing logic unit integral with a memory bank of the electronic memory.

BACKGROUND

A recent innovation within the field of integrated circuit technology is two-terminal memory technology. Two-terminal memory technology is contrasted, for instance, with gate-controlled transistors in which conductivity between two terminals is mediated by a third terminal, called a gate terminal. Two-terminal memory devices can differ from three terminal devices in function as well as structure. For instance, some two-terminal devices can be constructed between a pair of conductive contacts, as opposed to having a third terminal that is adjacent to a set of conductive terminals. Rather than being operable through a stimulus applied to the third terminal, two-terminal memory devices can be controlled by applying a stimulus at one or both of the pair of conductive contacts. The inventor of the present disclosure is further aware of a variety of two-terminal memory technologies, such as phase-change memory, magneto-resistive memory, conductive-bridging memory, as well as others.

One two-terminal memory worth noting is resistive memory. While much of resistive memory technology is in the development stage, various technological concepts for resistive memory have been demonstrated by the assignee of the present invention and are in one or more stages of verification to prove or disprove associated theory(ies). Even so, resistive memory technology promises to hold substantial advantages over competing technologies in the semiconductor electronics industry.

As models of resistive memory technology are tested and results obtained, the results are speculatively extrapolated to memory devices in which resistive memory replaces a conventional memory. For instance, the assignee of the present invention has conducted research related to software models of memory arrays comprising resistive memory instead of complementary metal-oxide semiconductor (CMOS) NAND or NOR memory. Software projections suggest that two-terminal memory arrays can provide significant benefits for electronic devices, including reduced power consumption, higher memory density, advanced technology nodes, or improved performance, among others.

In light of the above, the inventor(s) endeavors to discover applications where two-terminal memory can provide real-world benefits for electronic devices.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

The present disclosure provides a non-volatile memory device, having processing logic embedded within a memory bank of the non-volatile memory device. Commands for controlling the processing logic can be exposed to a host device, enabling the host device to activate processing capacity of the memory bank in conjunction with a memory operation. The processing capacity can be directed by a data command, transmitted by the host device, at read or write data identified by the memory operation. Read data can be processed by the memory bank before being output onto a data interface (e.g., a data latch, a shift register, etc.) connected to the memory bank. Likewise, write data received at the memory bank can be processed in conjunction with storing the write data in the non-volatile memory device.

In an embodiment, the present disclosure provides a non-volatile memory device. The non-volatile memory device can comprise a memory bank of non-volatile storage memory, sense amps configured to read data stored in a selected subset of the memory bank and a data buffer configured to receive input data over a data interface or to output data over the data interface. Moreover, the non-volatile memory device can comprise a processing logic unit configured to execute a data command in conjunction with the memory bank performing a memory operation related to acquiring read data from the non-volatile storage memory or storing write data to the non-volatile storage memory. Further, the processing logic at least one of: operates upon the read data to produce processed data in conjunction with executing the data command prior to the processed data being provided as output data onto the data interface by the data buffer, or operates upon the write data to produce the processed data in conjunction with executing the data command after the write data is received from the data interface into the data buffer.

In other embodiments, the subject disclosure provides a method for operating a memory device. The method can comprise receiving write data and a write address at a data buffer of a memory bank of non-volatile memory and receiving a data command pertaining to the write data. In addition, the method can comprise processing the write data according to the data command and producing processed data in response to successful execution of the data command. Moreover, the method can comprise writing the processed data to the write address of the memory bank in response to successful execution of the data command.

In one or more additional embodiments, the subject disclosure provides a method for operating a memory device. The method can comprise receiving a read command and read address at a memory bank of non-volatile memory and receiving a data command pertaining to data stored at the read address. Further, the method can comprise transferring read data from the read address into a data buffer. Additionally, the method can comprise producing processed data in response to successful execution of the data command and outputting the processed data to a host device in response to successful execution of the data command.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Various aspects or features of this disclosure are described with reference to the drawings, wherein like reference numerals are used to refer to like elements throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

The present disclosure relates to a non-volatile memory bank incorporating inline computing logic. The inline computing logic can facilitate on-chip processing of data read out from a memory bank of a memory chip, prior to the data being shifted out from the chip. Likewise, the inline computing logic can facilitate on-chip processing of write data after the write data is shifted onto the chip, and then processed data is written to the memory bank. Moreover, control of the on-chip processing can be exposed to a device external to the memory chip, such as a controller, a host computer, and so forth.

A memory bank, in the present context, relates to one or more arrays of non-volatile memory cells accessible by column and row addressing dedicated to the array(s) of non-volatile memory cells. With different language, non-volatile memory cells of a first memory bank can be addressed and accessed separately from the non-volatile memory cells of a second memory bank, which has separate dedicated column and row addressing. A memory device comprising multiple memory banks can have a common data path, and the memory banks can have respective data branches onto the common data path for transferring data between the respective memory banks and the common data path. The common data path can link to an input/output interface for the memory device for transferring data between the memory device and an external device, such as a host computer, a controller, or the like.

Figure 1:
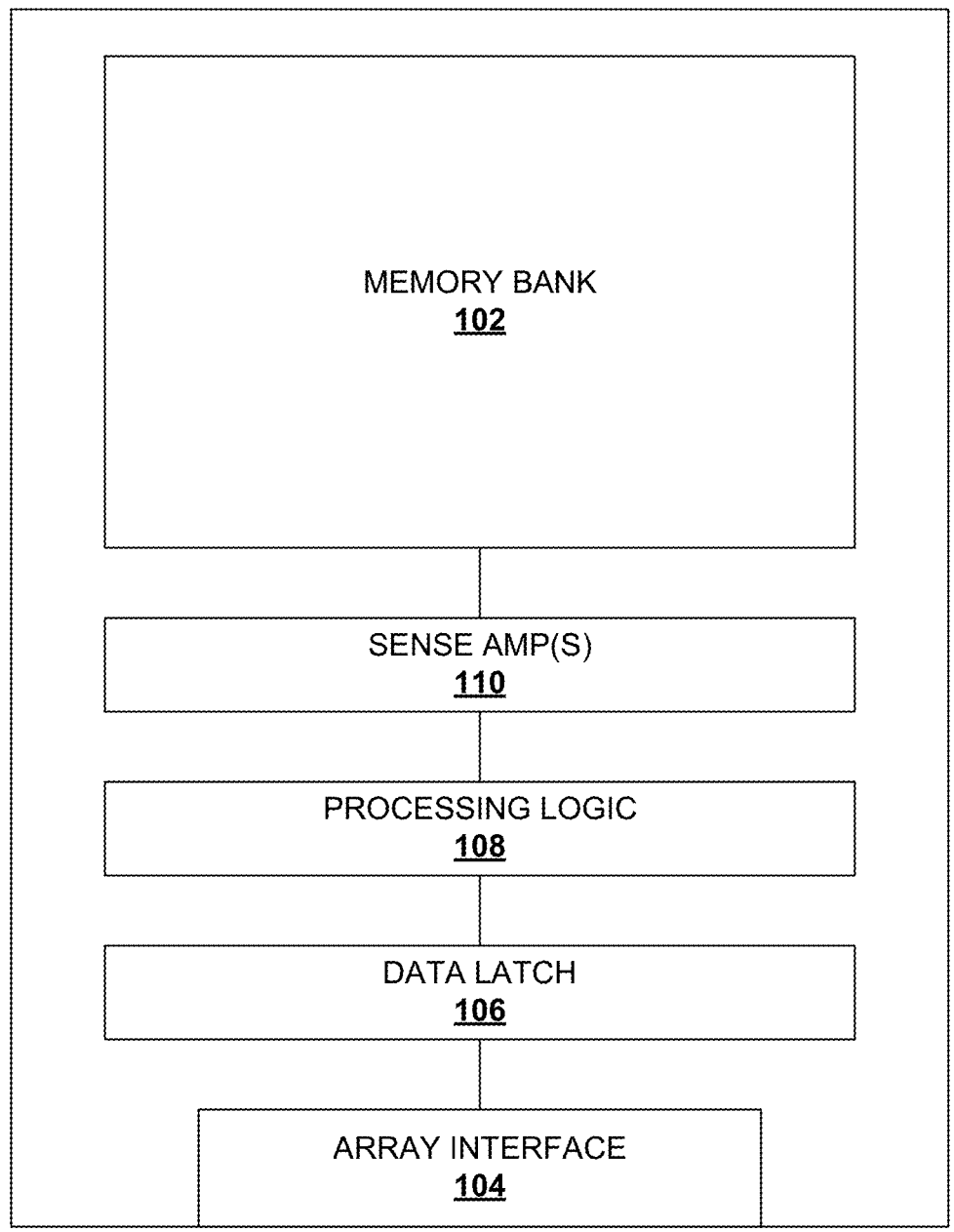
FIG. 1 depicts a block diagram of an example non-volatile memory bank with inline processing logic according to embodiments of the present disclosure.

Referring now to the drawings, FIG. 1 illustrates a block diagram of a sample non-volatile memory device 100 having a memory bank 102 with inline processing logic. Memory bank 102 can comprise one or more arrays of non-volatile memory cells for storing data. The non-volatile memory cells can be two-terminal memory, in an embodiment. Examples of suitable two-terminal memory can include resistive switching memory, phase change memory, magneto-resistive memory, conductive-bridging memory, or the like, or a suitable combination of the foregoing. In at least one embodiment, memory bank 102 comprises one or more arrays of non-volatile two-terminal resistive switching memory cells.

Non-volatile memory device 100 can further comprise a set of sense amps 110 for measuring signals representing data stored in a selected subset of the non-volatile memory cells of memory bank 102. A selected subset of memory cells can be identified via conventional array addressing techniques (not depicted, but see, e.g., FIG. 9, infra) to select a block of memory cells, one or more pages of memory cells, a portion of a page (or portions of multiple pages). Once selected, the subset of memory cells can be connected to sense amps 110, which are configured to read data from the connected subset of memory cells. The data read from connected memory cells is written to a data latch 106. Data latch 106 is generally a volatile memory structure for data storage (e.g., a SRAM circuit, an analogue or digital switch, a two-terminal volatile switch, a flip-flop, a transistor, a latch, and so forth), although data latch 106 is not so limited, and can be a non-volatile memory in some embodiments (e.g., a two-terminal non-volatile memory such as a two-terminal resistive switching memory cell, or the like). Data stored in data latch 106 can be output from non-volatile memory device 100 via an array interface 104, or can be written to memory bank 102, according to conventional read/write mechanisms in some embodiments. In further embodiments, data retrieved from memory bank 102 and stored in data latch 106 can be processed by processing logic 108 before being output from non-volatile memory device 100. Similarly, data received over array interface 104 can be processed by processing logic 108 before being written to memory bank 102, unlike conventional read/write mechanisms.

Array interface 104 can be a shift register, in some embodiments. When embodied as a shift register, array interface 104 shifts data from an external device (e.g., a host, a controller, a remote computing or processing device, and so forth) into data latch 106 over array interface 104. Processing by processing logic 108 can be implemented on data saved at data latch 106 after it is shifted into non-volatile memory device 100 by array interface 104, and before the data is written to memory bank 102. Processing of data after being shifted into data latch 106 is contrary to memory devices that only write the data shifted into data latch 106 as-is into memory bank 102, e.g., without processing. Array interface 104 can further shift data read from memory bank 102 to the external device when embodied as a shift register. The data read from memory bank 102 can be processed by processing logic 108 prior to being shifted out onto array interface 104, contrary to memory devices that merely shift out data saved at data latch 106 as-is, e.g., without processing. In at least one embodiment, data read from memory bank 102 and saved into data latch 106 can be processed by processing logic 108, and can be rewritten back to memory bank 102 (e.g., to an address(es) from which the data was read, or to a second (different) address(es) from which the data was read), or both rewritten back to memory bank 102 and shifted out over array interface 104.

Processing logic 108 can comprise hardware logic, in some embodiments (e.g., shift registers, logic gates, transistors, switches, latches, other circuitry or electronic hardware suitable for performing logic or mathematical operations on data, and so forth), software logic in other embodiments (e.g., instructions, data routines or processes for manipulating data, which are stored in volatile or non-volatile memory, or the like), or a combination of hardware logic and software logic in still other embodiments. In additional embodiments, control over processing logic 108 can be exported to an external device (e.g., a host device or computer). Commands and associated command data (e.g., command arguments, command filters, command algorithms, command parameters, values for the command or command argument(s)/filter(s)/algorithm(s)/parameter(s), and so forth) can be transferred to non-volatile memory device by the external device to cause processing logic 108 to perform logic or mathematical operations on data consistent with the commands and command data. Array interface 104 can additionally comprise a command interface for conveying the commands and associated command data to processing logic 108 from the external device, as well as for conveying command acknowledgments, command status (e.g., success, failure, busy, not busy, or the like) from processing logic 108 to the external device. Accordingly, non-volatile memory device 100 can serve to offload some processing capacity from the external device on data that has been shifted into non-volatile memory device 100, or on data read from memory bank 102 before the read data is shifted out from non-volatile memory device 100.

Figure 2:
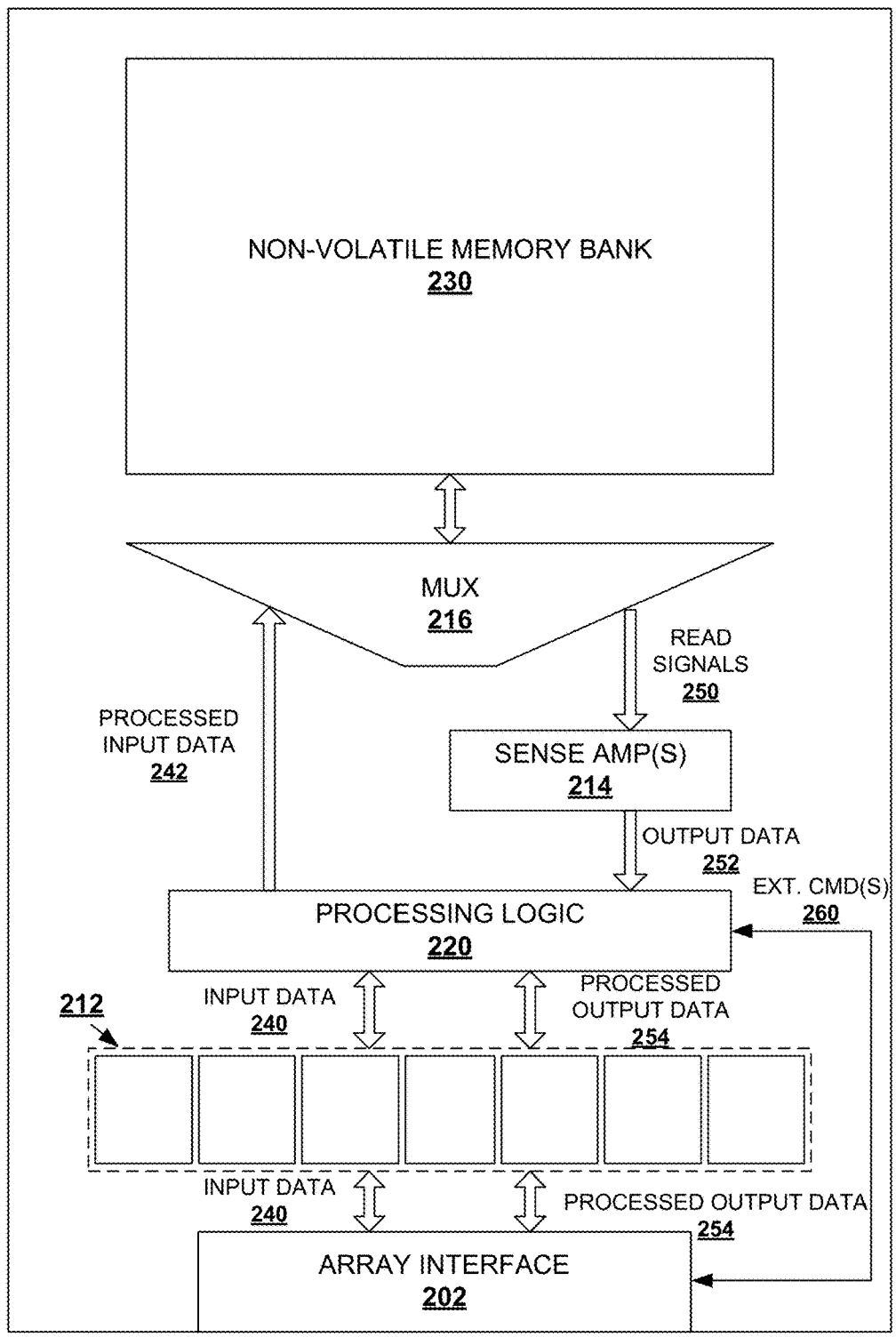
FIG. 2 illustrates a block diagram of a sample non-volatile memory chip according to further embodiments.

FIG. 2 illustrates a block diagram of a non-volatile memory chip 200 according to one or more additional embodiments of the present disclosure. Non-volatile memory chip 200 can be embodied on a single integrated circuit chip, in an embodiment. Non-volatile memory chip 200 can comprise a non-volatile memory bank 230 for storing data. A multiplexer 216 is provided and configured to selectively connect to/disconnect from subsets of the memory cells of non-volatile memory bank 230 for performing memory operations (e.g., read, write, overwrite, erase, etc.) on the subsets of the memory cells. A sense amp(s) 214 is provided to interpret signals acquired from non-volatile memory bank 230 in conjunction with a read operation, and interpret the signals into stored data. In at least one embodiment, non-volatile memory chip 200 does not have multiplexer 216, and in such embodiment sense amp(s) 214 (and processing logic 220, see below) can be connected directly with non-volatile memory bank 230. In other embodiments, multiplexer 216 can be any conventional multiplexer for selecting a subset of bitlines on a wordline (e.g., a portion of bitlines on the wordline; all bitlines on the wordline, fewer than all bitlines on the wordline, etc.) of non-volatile memory bank 230. A data buffer 212 is provided, optionally comprising multiple buffer subsets (illustrated by respective squares within the rectangular block of data buffer 212) for storing independent groups of data (e.g., independent pages of data, independent groups of pages of data, a block(s) of data, or other suitable buffer size) for writing to non-volatile memory bank 230, outputting from non-volatile memory chip 200, or processing by a processing logic 220. An array interface 202 is provided to facilitate receipt of data from an external device (not depicted), output of data to the external device, and transfer of commands (e.g., memory operation commands, logic operation commands), command data (e.g., arguments, filters, algorithms, parameters, etc.) and command acknowledgments between the external device and processing logic 220.

Inline data paths are illustrated by the two-dimensional (thick) arrows, whereas an inline command path is depicted by a thin arrow. Inline data paths include a write path for writing data to non-volatile memory bank 230 and a read path for reading data out from non-volatile memory bank 230. Inline command paths include a command path for transferring commands or command arguments to processing logic 220, and an acknowledgment path for transferring command status or acknowledgments out from non-volatile memory chip 200. Note that the different data paths and command paths are not necessarily embodied by separate data communication hardware. In some cases, all or a portion of all of the data path and read path can be transferred over a common set of electrical hardware (e.g., metal lines or other electrically conductive lines), or over dedicated electrical hardware in other cases.

Input data 240 provided by an external device in conjunction with a write operation can be transferred over array interface 202 (e.g., shifted into non-volatile memory chip 200, where array interface 202 is a shift register). The input data 240 utilizes the inline data path to be saved at data buffer 212 (or a subset of data buffer 212, such as one or more of the buffer subsets). Data buffer 212 can be a data latch, in some embodiments, or a volatile memory (e.g., SRAM, etc.) in other embodiments, or a non-volatile memory (e.g., Flash, two-terminal resistive switching memory, Magnetic memory, and so forth) in yet other embodiments. A logic command(s) or command argument(s) for performing a logic or mathematical operation on input data 240 is transferred by the external device over array interface 202 via the inline command path to processing logic 220. Processing logic 220 can access input data 240 from data buffer 212 and process input data 240 according to the command(s) or command argument(s), producing processed input data 242. Processed input data 242 can be provided to multiplexer 216 for writing to non-volatile memory bank 230. In an embodiment, processed input data 242 can alternatively or additionally be written to data buffer 212 for output over array interface 202, in response to the logic command(s). Note that a write command for writing processed input data 242 to non-volatile memory bank 230 is separate from (and optionally in addition to) the logic command(s) employed by processing logic 220 for implementing the logic or mathematical operation on input data 240, though the write command can also be transmitted over array interface 202 (and optionally the inline command path) in conjunction with the logic command(s).

In the context of a read memory operation, a read command specifies or indicates (in the case of virtual addressing) a read address(es) in non-volatile memory bank 230. Multiplexer 216 obtains read signals 250 from the read address(es) and provides read signals 250 to sense amp(s) 214. Sense amp(s) 214 generates output data 252 from read signals 250 representing data stored at the address(es) of non-volatile memory bank 230, which can be operated on by processing logic 220 according to a logic command(s). Processing logic 220 generates processed output data 254 in response to implementing the logic command(s) on output data 252, and transfers processed output data 254 to data buffer 212 (or one or more buffer subsets thereof). The processed output data 254 can be provided over array interface 202 to an external device issuing the read memory operation and the logic command, in response to the read memory operation and logic command. In an alternative or additional embodiment, processed output data 254 can be rewritten to a rewrite address(es) of non-volatile memory bank 230, if the logic command includes a rewrite command and rewrite address(es). The rewrite address(es) can be the read address(es) or a second (different) address(es), or a combination of the foregoing. Note that the read command for reading output data 252 from non-volatile memory bank 230 is separate from (and optionally in addition to) the logic command(s) employed by processing logic 220 the logic or mathematical operation on the output data 252, though the read command can also be transmitted over array interface 202 (and optionally the inline command path) in conjunction with the logic command(s).

In a further embodiment, read or write commands can employ complex arguments that both provide data (e.g., write data) with the command and acquire data (e.g., read data) from non-volatile memory bank 230 to implement the logic command. For a complex write command, the command can include write data, a logic command (and optional argument(s)), a read address for non-volatile memory bank 230, and a write address. Processing logic 220 can acquire data stored at the read address (utilizing multiplexer 216 and sense amp(s) 214) and operate on the read data and the write data as required by the logic command (optionally including the command argument(s)) to then generate the processed input data 242. The processed input data 242 can then be written to the write address of non-volatile memory bank 230. For a complex read command, the command can include command data, a logic command (and optional argument(s)), a read address for non-volatile memory bank 230, and a logic command. Data stored at the read address can be acquired via multiplexer 216 and sense amp(s) 214, and the acquired data can be processed in conjunction with the command data to generate processed output data 254. The processed output data 254 can then be output over array interface 202. In another embodiment, a read command can include a query command and query criteria. Processing logic 220 can execute the query criteria and, in response to the query criteria being met, data located at a read address can be acquired from non-volatile memory bank 230. In an embodiment, the data located at the read address can be processed according to a logic command in conjunction with executing the query criteria. In a further embodiment, command data can be provided with the read command and the query command, and processing the read data according to the logic command can incorporate the command data in generating processed output data 254.

The logic command can generally include a type of operation to be performed by processing logic 220 on output data 252 or input data 240. The logic command can optionally include an address to read data from non-volatile memory bank 230 (e.g., a source address(es)), an address for data to be written into non-volatile memory bank 230 (e.g., a destination address(es)), or a combination thereof (a source address(es) for retrieving data and a destination address(es) for storing processed data, as one example). Specific examples of the type of operation, though in no way limiting, can include an 'AND', logic operation, an 'OR' logic operation, a 'XOR' logic operation, a 'NOR' logic operation, or any other suitable logic operation, or a combination of such logic operations, in an embodiment. As another example, the type of operation can be a suitable mathematical operation. As yet another example, the logic command can comprise a data filter and can include a filter argument, and can specify a set of conditional responses. The data filter command can compare source data (or processed data) to the filter argument, and perform one or more of the set of conditional responses depending on a result of the comparison. As a further illustrative example, the data filter command can compare the source (or processed) data to the filter argument and, in response to the data matching the filter argument, output the data (or rewrite the data to non-volatile memory bank 230), and in response to the data not matching the filter argument, output a filter command error. Other suitable types of data operations known in the art or made known to one of ordinary skill in the art by way of the context disclosed herein can be utilized for the type of operation.

Various advantages can be achieved by the non-volatile memory chip 200 of FIG. 2, as well as other embodiments disclosed herein. For instance, processing capability can be offloaded from a host CPU, facilitating distributed computing among non-volatile memory chip 200 and a host device. The distributed computing can reduce traffic to/from non-volatile memory chip 200 over array interface 202 in some implementations (e.g., where processed data is larger than the command, command data or argument(s) sent over array interface 202 to implement the command). Further, power consumption for transmitting data over array interface 202 can be reduced in such embodiments, as well as a need for high speed or high throughput interface between host and memory device.

Figure 3:
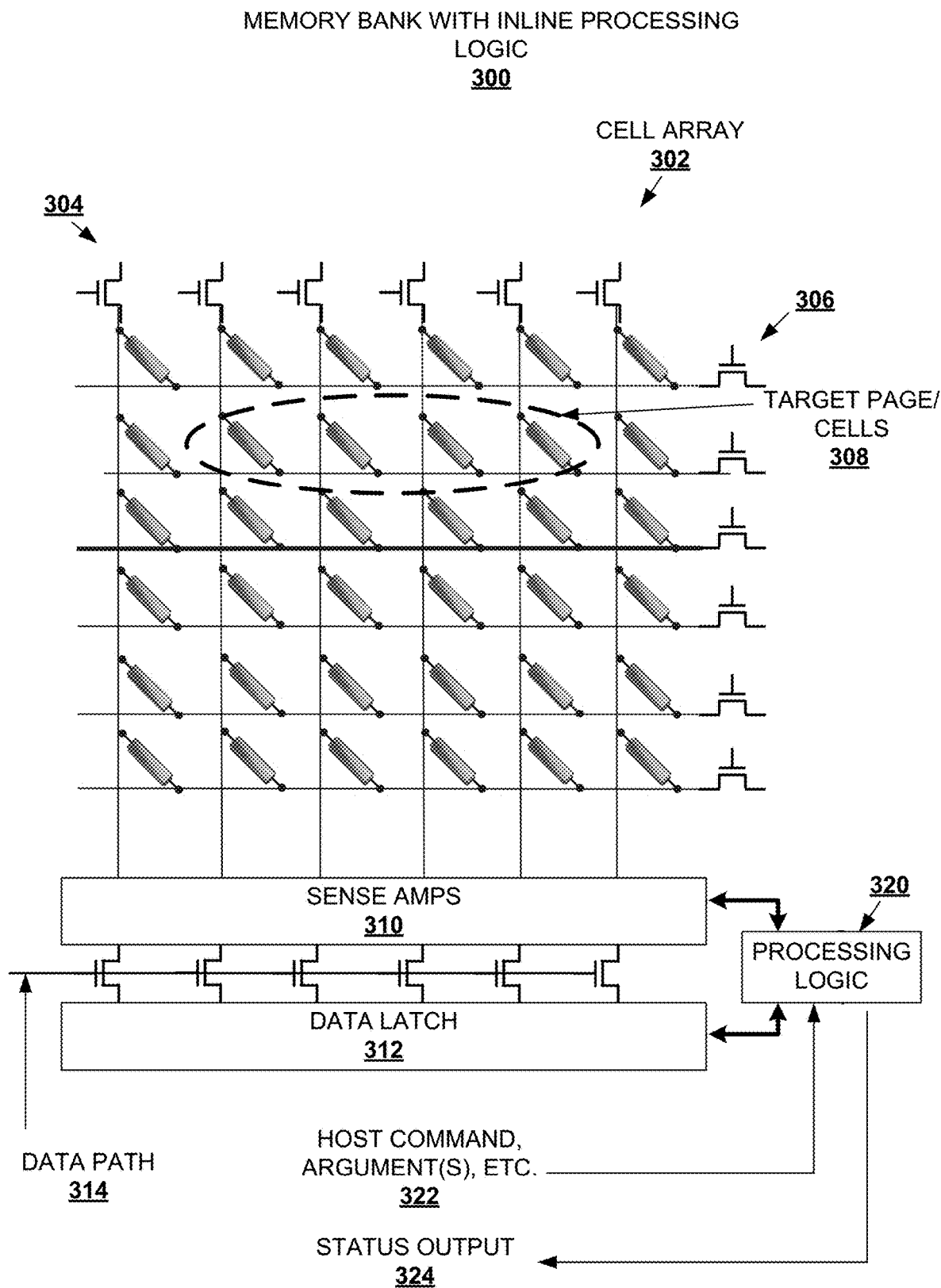
FIG. 3 depicts a block diagram of a sample memory bank comprising inline processing logic according to alternative or additional embodiments.

FIG. 3 depicts a block diagram of an example memory bank 300 with inline processing logic, according to alternative or additional embodiments of the present disclosure. Memory bank 300 can comprise a cell array 302 having multiple columns 304 and multiple rows 306 of non-volatile resistive switching memory cells. Sense amps 310 for reading data from a target page/cells 308 of cell array 302 is provided, as well as a data latch 312 for latching data received from an external device over a data path 314, or latching data read from cell array 302 by sense amps 310. Target page/cells 308 can include all cells on a wordline, in some embodiments (e.g., selecting an entire page of cells) or can include fewer than all cells on the wordline in other embodiments (e.g., selecting less than the entire page of cells). Data path 314 can be utilized to import data from an external device, such as a host device or host computer (not depicted), or to export data to the external device. A command path (not depicted) can be utilized to receive memory commands, logic commands (and command data, where applicable) for implementation by processing logic 320, or source/destination address(es) of cell array 302.

Data received on data path 314 can be written to data latch 312. Host command information 322 received over the command path in conjunction with the data can include a write command, a logic command and optionally command data (such as command argument/filter/algorithm/parameter, etc.), as well as a destination address for the write command. Processing logic 320 can process the latched data according to the logic command and optionally the command data, and implement the write command to store processed data to target page/cells 308 specified by the destination address. A result of the memory operation as well as of the logic operation can be output as a status output 324 over the command path.

A read command can be accompanied by a logic command and optionally command data, as well as a source address for the read data. Sense amps 310 read data stored at the source address and transfer the read data to data latch 312. The latched data is processed according to the logic command and optionally the command data, producing processed read data. The processed read data can be output over data path 314 in response to the read command. In some embodiments, the processed read data can alternatively (or additionally) be rewritten to cell array 302, either to the source address or to a different rewrite address. In response to a failure to read the data from the source address, a read operation failure can be output as a status output 324 in response to the read command. In response to a failure of the logic command, a logic command failure can be output as the status output 324 in response to the read command. Processing logic 320 can be substantially similar to processing logic 108 or processing logic 220, in one or more embodiments. In further embodiments, processing logic 320 can be substantially as described at FIG. 4, infra.

In one or more embodiments, data path 314, data latch 312 and sense amps 310 can perform conventional memory operations (e.g., read operation, write operation, erase operation, overwrite operation, etc.). This can be implemented by bypassing processing logic 320, for example. Thus, data received on data path 314 can be written to memory cells of cell array 302 that correspond to a received address (e.g. target page/cells 308), in an embodiment, without processing logic 320 implementing any processing on the received data. Likewise, data retrieved by sense amps 310 in response to a read command can be output on data path 314 without being processed at processing logic 320, in further embodiments. Optionally bypassing processing logic 320 can therefore provide conventional memory operations, in such embodiments. Although not specifically depicted, other memory devices disclosed herein may incorporate a bypass of processing or of processing logic, in some embodiments.

Figure 4:
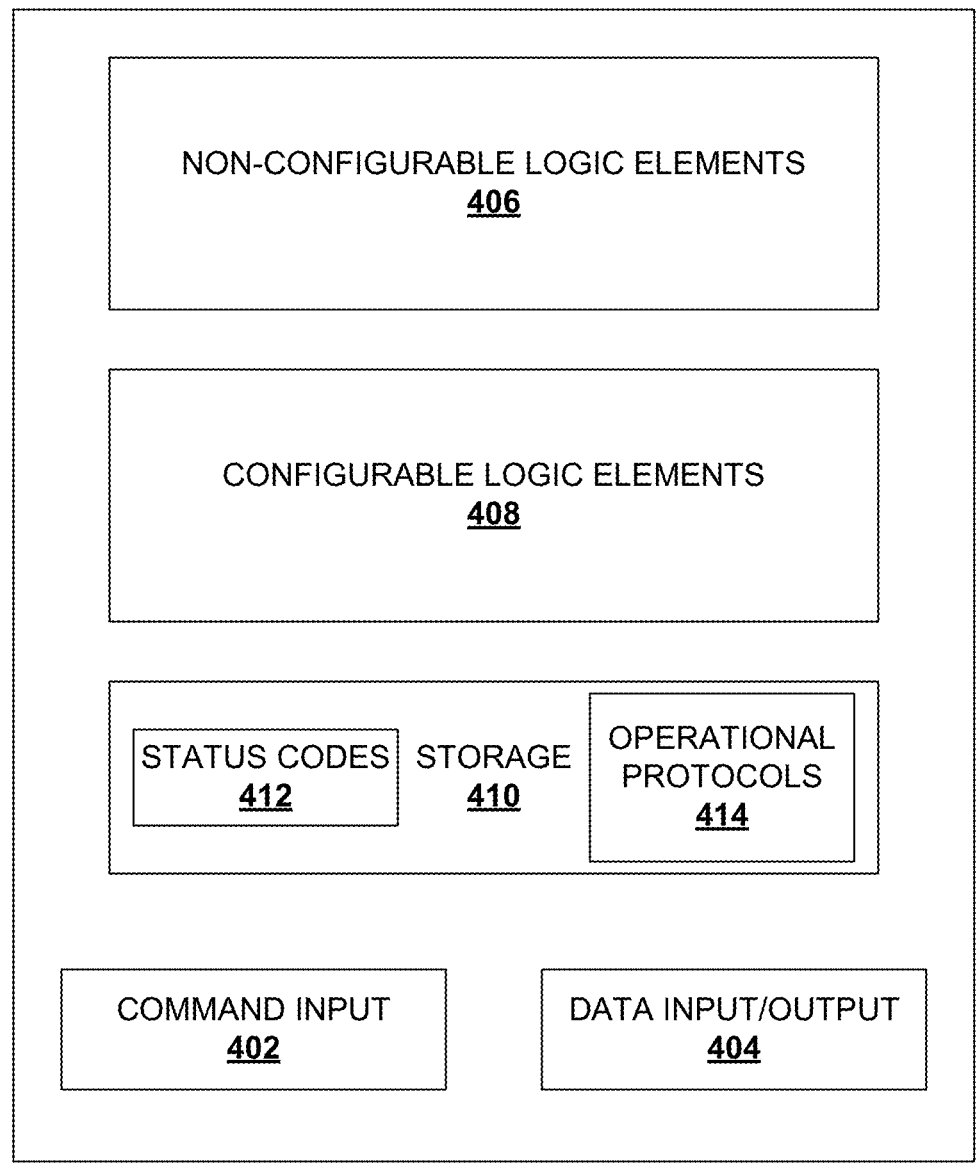
FIG. 4 depicts a block diagram of an example inline processing logic unit according to other embodiments.

FIG. 4 depicts a block diagram of example inline processing logic 400 for a memory bank of a memory device, in one or more embodiments. Inline processing logic 400 can comprise a command input 402 and a data input/output 404. Command input 402 facilitates receipt of logic operation commands, command data associated with the logic operation commands, and source or destination addresses for the logic operation commands. Data input/output 404 serves as an interface for inline processing logic 400 to receive data associated with a logic operation command, and for processing the data according to the logic operation command.

Data processing can be implemented by non-configurable logic elements 406, or configurable logic elements 408, in various embodiments and subject to implementation. Non-configurable logic elements 406 can include hardcoded logic structures, such as logic structures fabricated to perform a logic/mathematical operation or a set of logic/mathematical operations, or can include instructions stored in ROM for implementing the logic/mathematical operation(s) coupled with processing hardware to implement the instructions stored in ROM. Configurable logic elements 408 can include programmable logic structures, such as programmable logic gates, programmable switches, programmable transistors, programmable flip-flops, or other suitable programmable logic elements, or combinations of the foregoing, which can be programmed to implement the logic/mathematical operation(s). Alternatively, or in addition, configurable logic elements 408 can include instructions stored in rewritable memory for implementing the instructions on processing hardware. In one or more embodiments, a combination of the non-configurable logic elements 406 and configurable logic elements 408 can be provided to implement the logic/mathematical operation(s), separately or in coordination.

Inline processing logic 400 can further comprise storage memory 410 that includes status codes 412 and operational protocols 414. Status codes 412 can include rules for submitting acknowledgments to memory operations or logic operations. For instance, a first set of acknowledgments can be implemented for success or failure of memory operations, and a second set of acknowledgments can be implemented for success or failure of logic operations. Operational protocols 414 can include a mapping between logic commands and associated command data (e.g., arguments, filters, algorithms, parameters, etc.) and the logic/mathematical operations referenced by the commands, as well as utilization of the command data for implementing the commands. Status codes 412 and operational protocols 414 can be stored in read only storage, or erasable storage, in various embodiments, depending on implementation.

The aforementioned diagrams have been described with respect to interaction between several components of an electronic device, an interface, a memory device, or memory architecture. It should be appreciated that in some suitable alternative aspects of the subject disclosure, such diagrams can include those components, devices, interfaces, architectures, etc., specified therein, some of the specified components/devices/interfaces/architectures, or additional components/devices/interfaces/architectures. Sub-components can also be implemented as connected to other sub-components rather than included within a parent component. For example, multiple memory banks can be provided on separate memory chips, instead of on a single chip, or as an illustrative example, status codes 412 and operational procedures 414 can be stored on separate storage media rather than included in the same storage media. Additionally, it is noted that one or more disclosed processes can be combined into a single process providing aggregate functionality. Components of the disclosed devices/architectures can also interact with one or more other components not specifically described herein but known by those of skill in the art.

In view of the exemplary diagrams described supra, process methods that can be implemented in accordance with the disclosed subject matter will be better appreciated with reference to the flow charts of FIGS. 5-8. While for purposes of simplicity of explanation, the methods of FIGS. 5-8 are shown and described as a series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the methods described herein. Additionally, it should be further appreciated that some or all of the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium.

Figure 5:
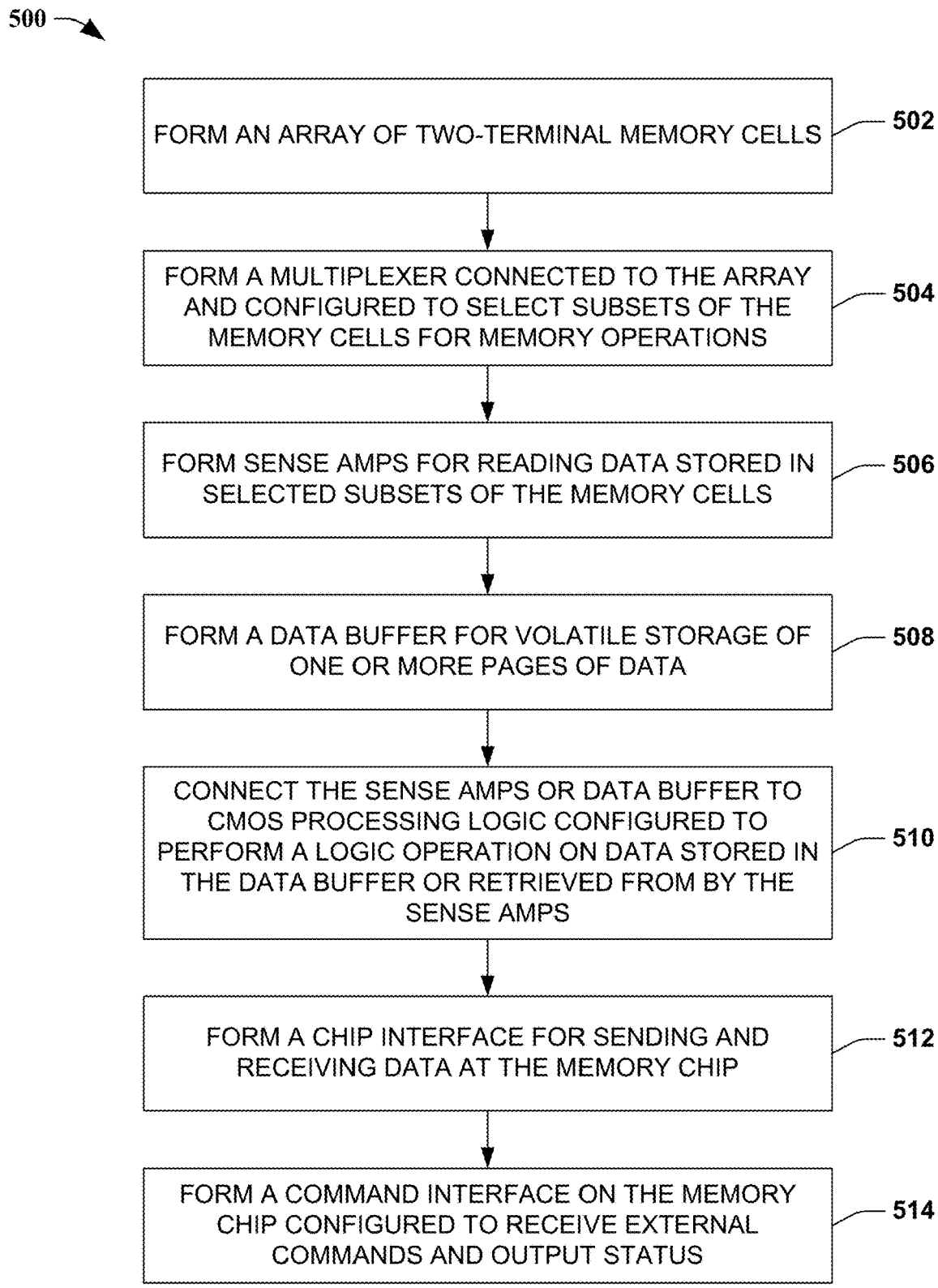
FIG. 5 illustrates a flowchart of a sample method for fabricating a memory bank comprising inline processing logic, in an embodiment(s)

FIG. 5 illustrates a flowchart of a sample method 500 for fabricating a memory device in one or more disclosed embodiments. At 502, method 500 can comprise forming an array of two-terminal memory cells on an integrated circuit chip. At 504, method 500 can optionally comprise forming a multiplexer connected to the array of two-terminal memory cells and configured to select subsets of the memory cells for memory operations. In an alternative embodiment, the method 500 can fabricate the memory device without the multiplexer. At 506, method 500 can comprise forming sense amps connected to the multiplexer and, through the multiplexer, the array of two-terminal memory cells and configured for reading data stored in a selected subset of the two-terminal memory cells. In the alternate embodiment, the sense amps can be formed connected directly to the array of two-terminal memory cells, without an intervening multiplexer. At 508, method 500 can comprise forming a data buffer for volatile storage of one or more pages of data. In an embodiment, the data buffer can store data smaller than a page of data, or can store data larger than a page of data. At 510, method 500 can comprise connecting the sense amps or data buffer to CMOS processing logic configured to perform a logic or mathematical operation on data stored in the data buffer or retrieved by the sense amps. At 512, method 500 can comprise forming a chip interface for sending and receiving data at the memory chip, and at 514, method 500 can comprise forming a command interface on the memory chip configured to receive external memory commands and external logic or mathematical commands, and output status. The status can include memory operation status, in addition to logical/mathematical operation status, in an embodiment.

Figure 6:
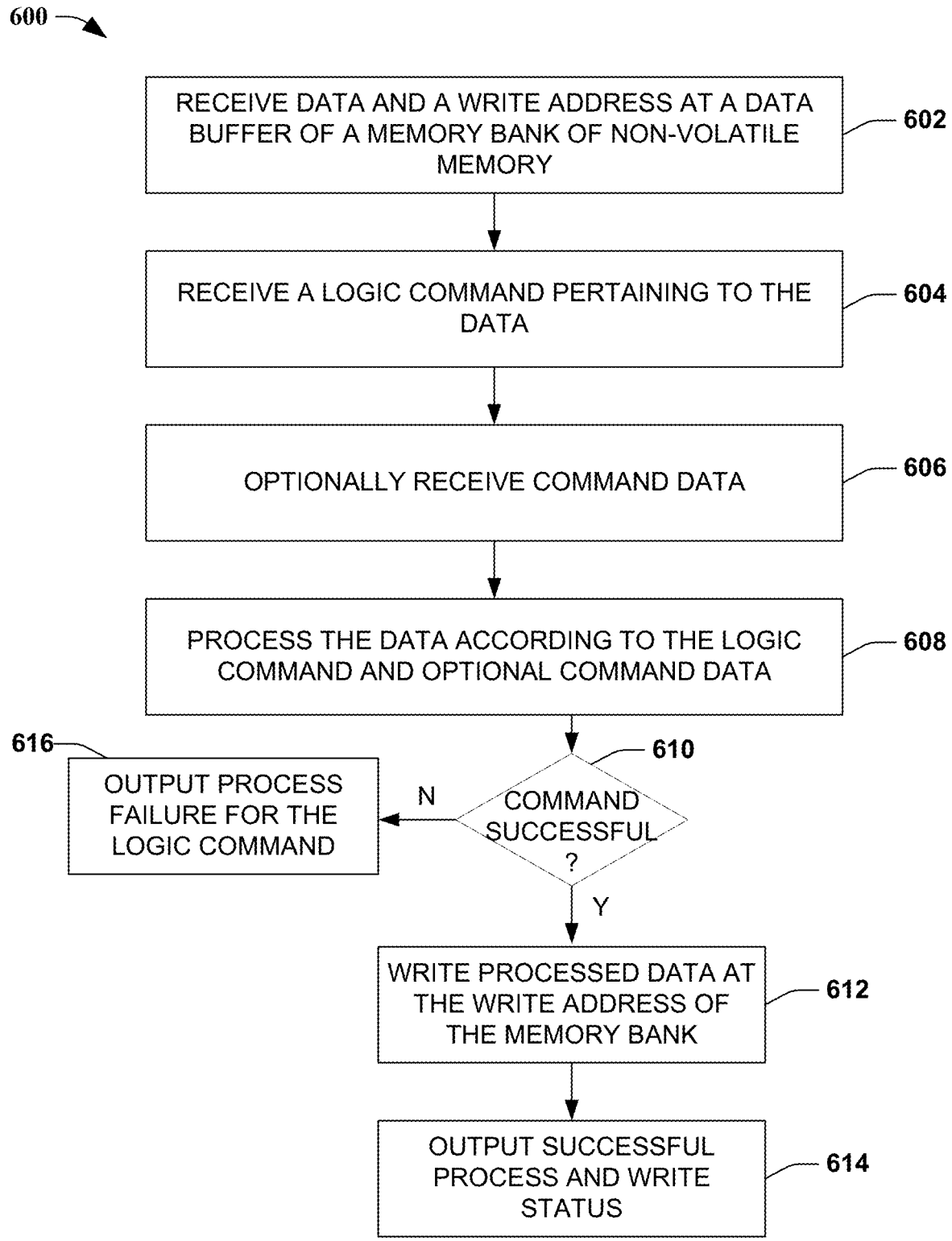
FIG. 6 depicts a flowchart of a sample method for writing data to a memory bank with inline processing, in further embodiments.

FIG. 6 depicts a flowchart of a sample method 600 for operating a memory device according to one or more additional embodiments. At 602, method 600 can comprise receiving write data and a write address at a data buffer of a memory bank of non-volatile memory. At 604, method 600 can comprise receiving a data command pertaining to the write data, and at 606, method 600 can comprise optionally receiving command data for implementing the data command. Command data can include a command argument (e.g., a value, an operator, a variable, etc.), a command filter, a command algorithm, a command parameter, a query criterion (or criteria), data to be operated upon (alone, or in conjunction with read data), or the like, or a suitable combination thereof. At 608, method 600 can comprise processing the write data according to the command and optional command data. At 610, a determination is made as to whether the logic command was successful. If successful, method 600 can proceed to 612; if unsuccessful method 600 proceeds to 616 and outputs a process failure for the logic command. At 612, method 600 can comprise writing processed write data at the write address of the memory bank. At 614, method 600 can comprise outputting successful process and write status.

Figure 7:
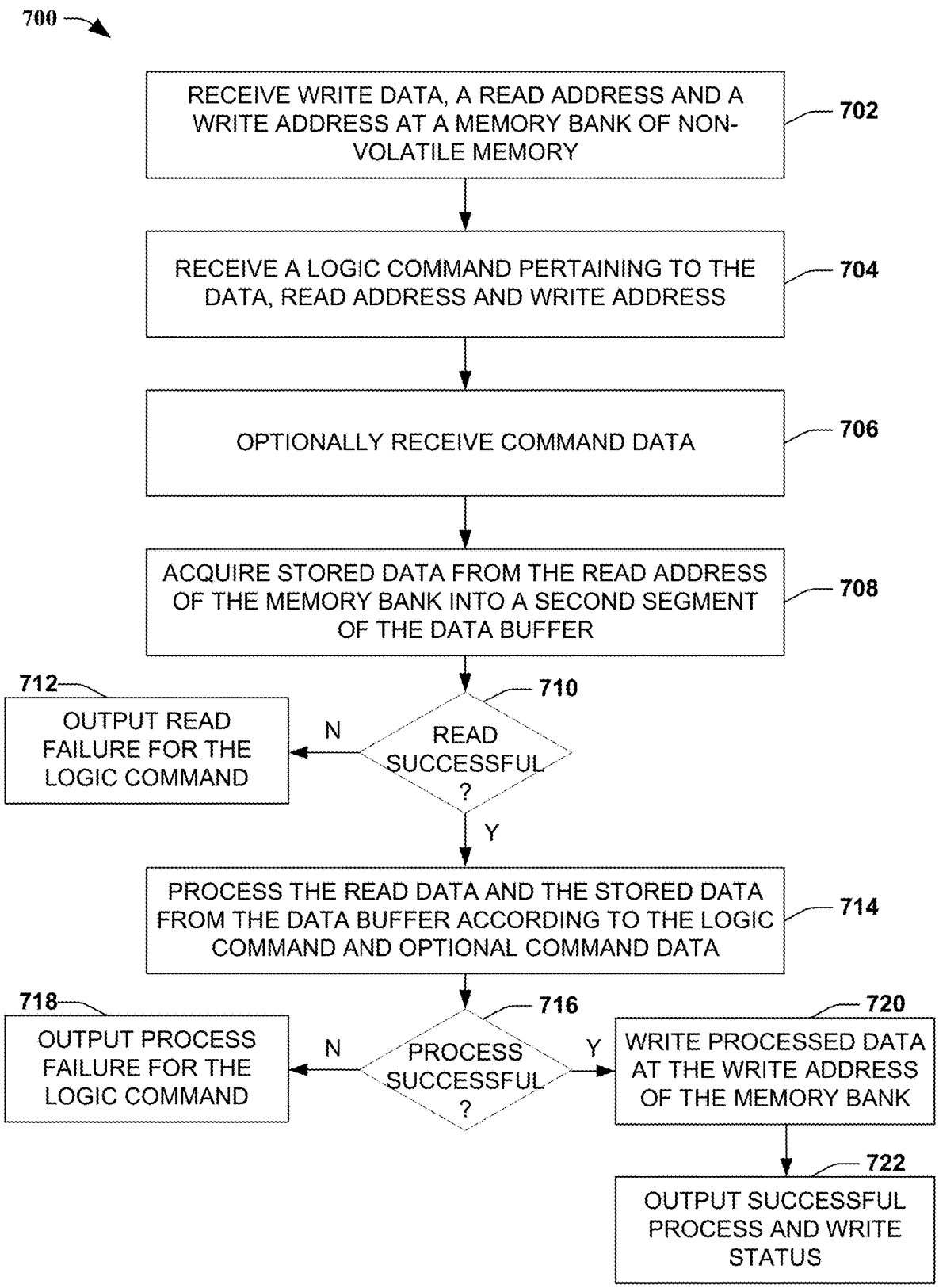
FIG. 7 illustrates a flowchart of a sample method for processing data and writing processed data to a memory bank, in further embodiments.

FIG. 7 depicts a flowchart of an example method 700 for operating a memory device according to alternative or additional embodiments of the disclosure. At 702, method 700 can comprise receiving write data, a read address and a write address at an interface of a memory bank of a non-volatile memory. The write data can be saved at a first segment of a data buffer, in an embodiment. At 704, method 700 can comprise receiving a logic command pertaining to the data, read address and write address. The logic command can reference a logic or mathematical operation that the memory device is programmed to identify, and configured to implement utilizing processing hardware or software. At 706, method 700 can comprise optionally receiving command data pertaining to the logic command in conjunction with the logic command. The command data can include a logic/mathematical argument, a logic/mathematical filter, a logic/mathematical operator, a logic/mathematical algorithm, a logic/mathematical parameter, a query criterion (criteria), data to be operated upon, or the like, or a suitable combination thereof. At 708, method 700 can comprise acquiring stored data from the read address of the memory bank into a second segment of the data buffer, and at 710, method 700 can comprise determining whether the read is successful. In response to a successful read, method 700 can proceed to 714. In response to an unsuccessful read, method 700 can proceed to 712, and can comprise outputting a read failure in response to the logic command.

At 714, method 700 can comprise processing the read data from the second segment of the data buffer in conjunction with the write data from the first segment of the data buffer. The processing can be according to the logic command and optionally incorporating or as a function of the command data. At 716, a determination is made as to whether the processing is successful. In response to unsuccessful processing, method 700 can proceed to 718 and can comprise outputting a process failure in response to the logic command. In response to successful processing, method 700 can proceed to 720 and write processed data to the write address of the memory bank. At 722, method 700 can comprise outputting a process success and write status for the processed data.

Figure 8:
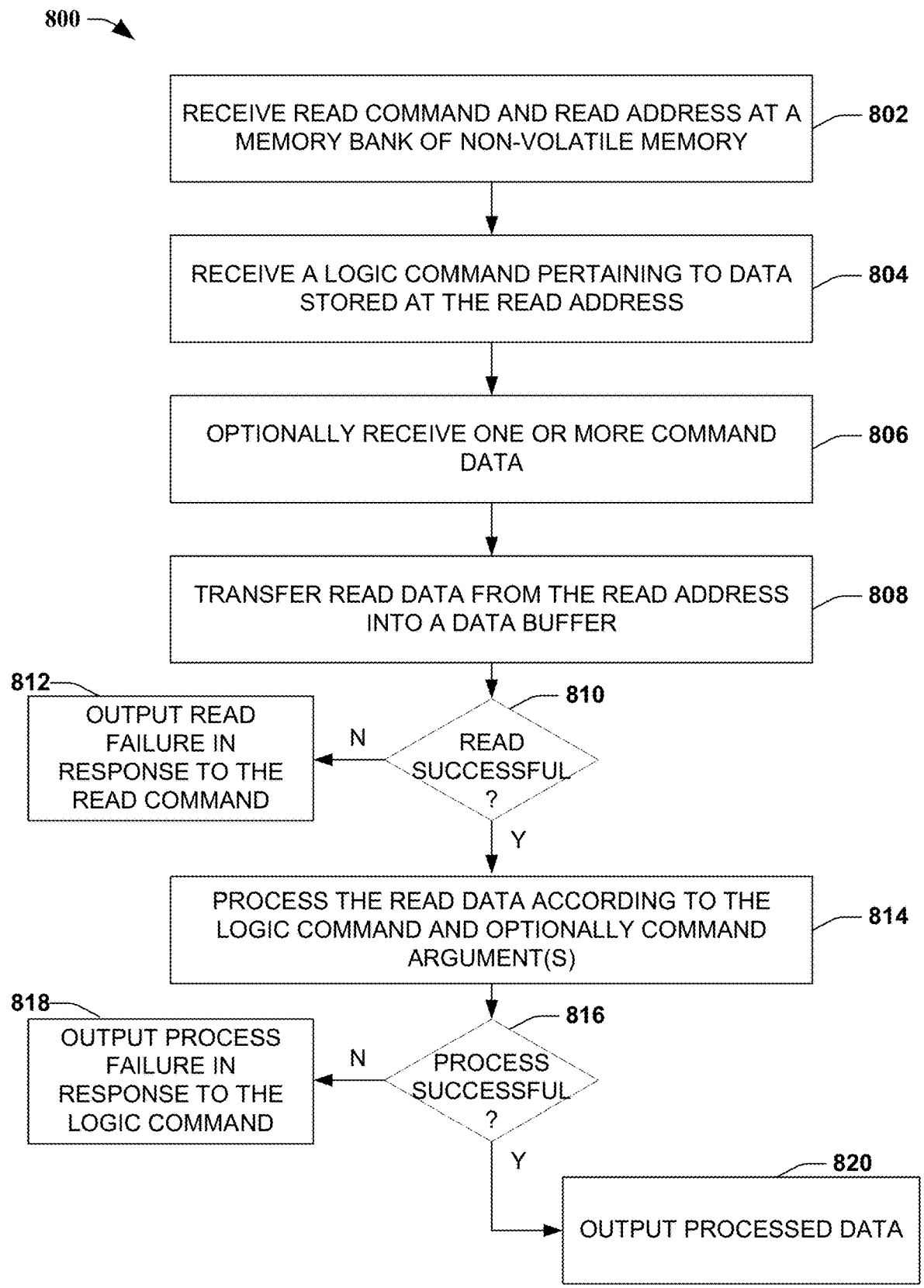
FIG. 8 depicts a flowchart of an example method for reading data from a memory bank with inline processing, in still other embodiments.

FIG. 8 illustrates a flowchart of a sample method 800 for operating a memory device according to additional embodiments of the present disclosure. At 802, method 800 can comprise receiving a read command and a read address at a command interface of a memory bank of non-volatile memory. At 804, method 800 can comprise receiving a logic command pertaining to data stored at the read address. The logic command can reference a logic or mathematical operation that the memory device is programmed to identify, and configured to implement utilizing processing hardware or software. At 806, method 800 can comprise optionally receiving command data pertaining to the logic command in conjunction with the logic command. The command data can include a logic/mathematical argument, a logic/mathematical filter, a logic/mathematical operator, a logic/mathematical algorithm, a logic/mathematical parameter, a query criterion (criteria), data to be operated upon, or the like, or a suitable combination thereof. At 808, method 800 can comprise transferring read data from the read address into a data buffer, in response to the read command. At 810, a determination can be made as to whether transferring the read data from the read address into the data buffer is successful. If not successful, method 800 can proceed to 812 where a read failure is output in response to the read command. Otherwise, method 800 can proceed to 814.

At 814, method 800 can comprise processing the read data according to the logic command and optionally the command data. At 816, a determination is made as to whether the processing of the read data was successful. If not, method 800 can proceed to 818 and output a process failure in response to the logic command. If the processing of read data is successful, method 800 can proceed to 820 where processed data is output in response to the read command and the logic command.

Figure 9:
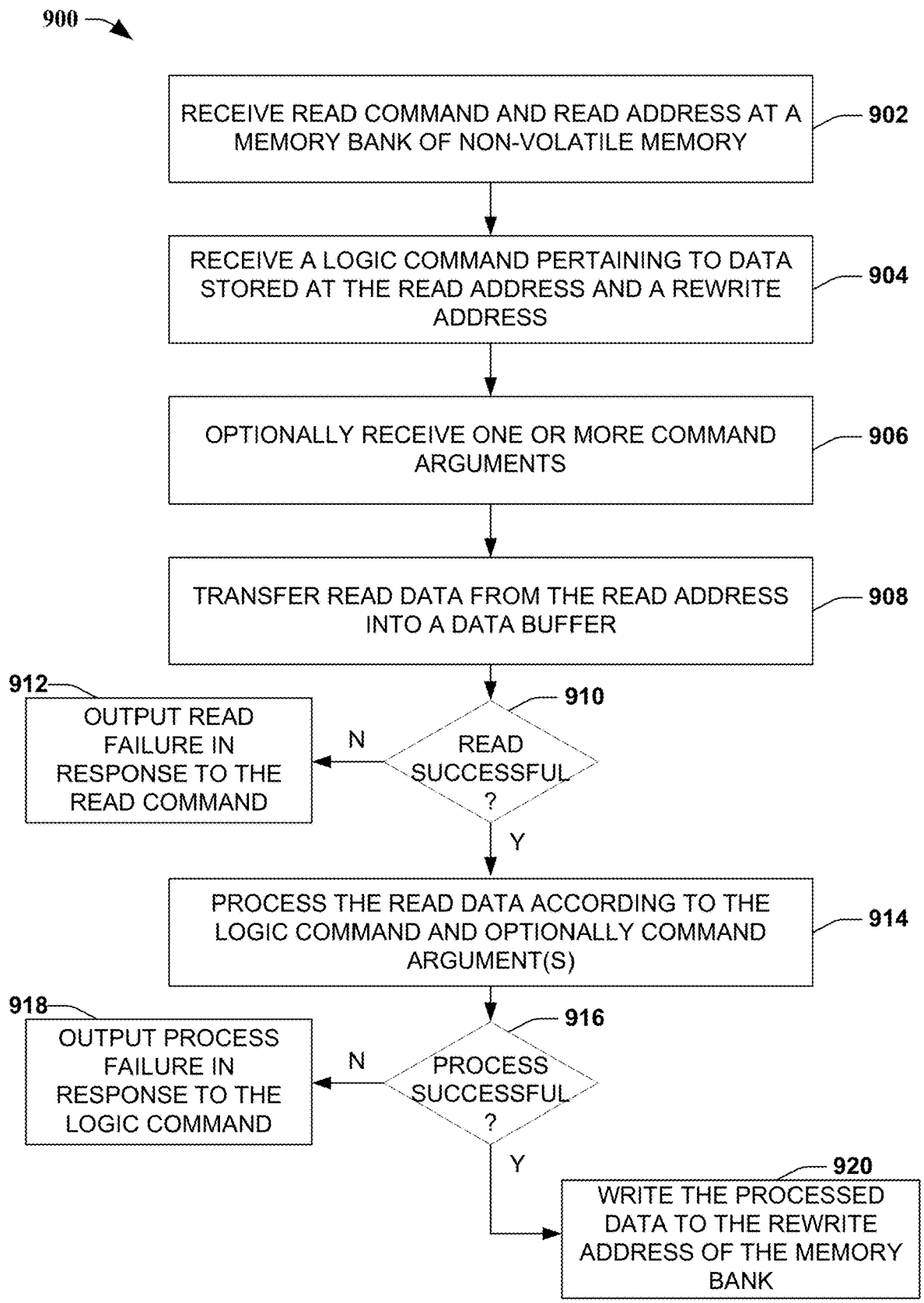
FIG. 9 depicts a flowchart of an example method for reading data from a memory bank and rewriting processed data, in alternative embodiments.

FIG. 9 illustrates a flowchart of a sample method 900 for operating a memory device according to additional embodiments of the present disclosure. At 902, method 900 can comprise receiving a read command and a read address at a command interface of a memory bank of non-volatile memory. At 904, method 900 can comprise receiving a logic command pertaining to data stored at the read address, and a rewrite address. The logic command can reference a logic or mathematical operation that the memory device is programmed to identify, and configured to implement utilizing processing hardware or software. At 906, method 900 can comprise optionally receiving command data pertaining to the logic command in conjunction with the logic command. The command data can include a logic/mathematical argument, a logic/mathematical filter, a logic/mathematical operator, a logic/mathematical algorithm, a logic/mathematical parameter, or the like, or a suitable combination thereof. At 908, method 900 can comprise transferring read data from the read address into a data buffer, in response to the read command. At 910, a determination can be made as to whether transferring the read data from the read address into the data buffer is successful. If not successful, method 900 can proceed to 912 where a read failure is output in response to the read command. Otherwise, method 900 can proceed to 914.

At 914, method 900 can comprise processing the read data according to the logic command and optionally the command data. At 916, a determination is made as to whether the processing of the read data was successful. If not, method 900 can proceed to 918 and output a process failure in response to the logic command. If the processing of read data is successful, method 900 can proceed to 920 where processed data is written to the rewrite address of the memory bank, in response to the read command and the logic command.

Figure 10:
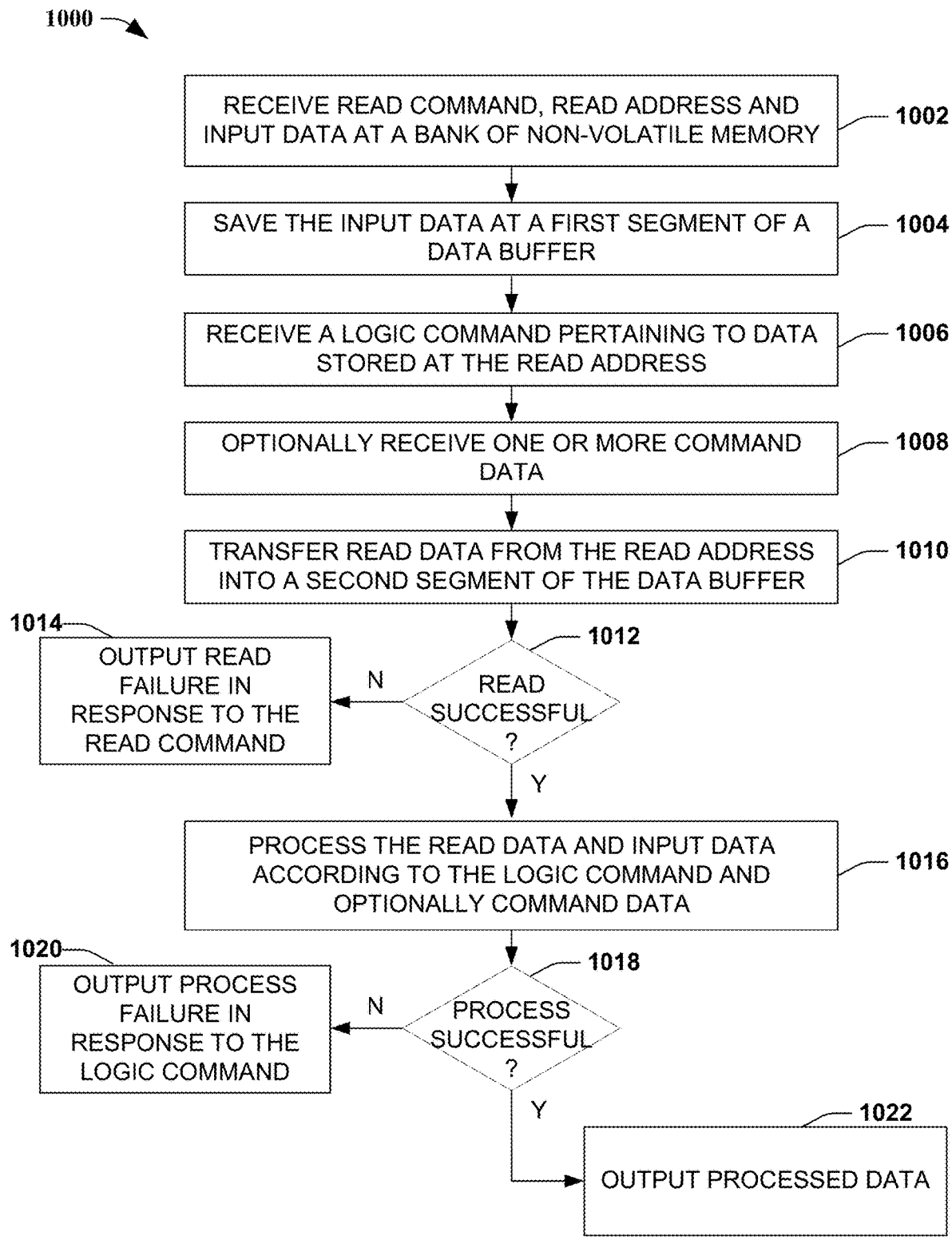
FIG. 10 depicts a flowchart of a sample method for processing data and outputting processed data in response to a read command, in an embodiment(s)

FIG. 10 depicts a flowchart of a sample method 1000 for operating a memory bank of a non-volatile memory device according to still other embodiments. At 1002, method 1000 can comprise receiving a read command, a read address and input data at an input interface of the memory bank. At 1004, method 1000 can comprise saving the input data at a first segment of a data buffer. At 1006, method 1000 can comprise receiving a logic command pertaining to the read command, read address and input data. The logic command can reference a logic or mathematical operation that the memory device is programmed to identify, and configured to implement utilizing processing hardware or software. At 1008, method 1000 can comprise optionally receiving command data pertaining to the logic command in conjunction with the logic command. The command data can include a logic/mathematical argument, a logic/mathematical filter, a logic/mathematical operator, a logic/mathematical algorithm, a logic/mathematical parameter, a query criterion (criteria), data to be operated upon, or the like, or a suitable combination thereof. At 1010, method 1000 can comprise transferring read data from the read address into a second segment of the data buffer. At 1012, method 1000 can determine whether the transferring read data to the second segment of the data buffer is successful, and if successful method 1000 can proceed to 1016. Otherwise, method 1000 can proceed to 1014 and can comprise outputting a read failure in response to the read command.

At 1016, method 1000 can comprise processing the read data from the second segment of the data buffer and the input data from the first segment of the data buffer according to the logic command and optionally according to the command data. At 1018, method 1000 can determine whether the processing is successful. In not successful, method 1000 can proceed to 1020 and output a process failure in response to the read command and the logic command. If successful, method 1000 can proceed to 1022 and output processed data in response to the read command and the logic command.

Figure 11:
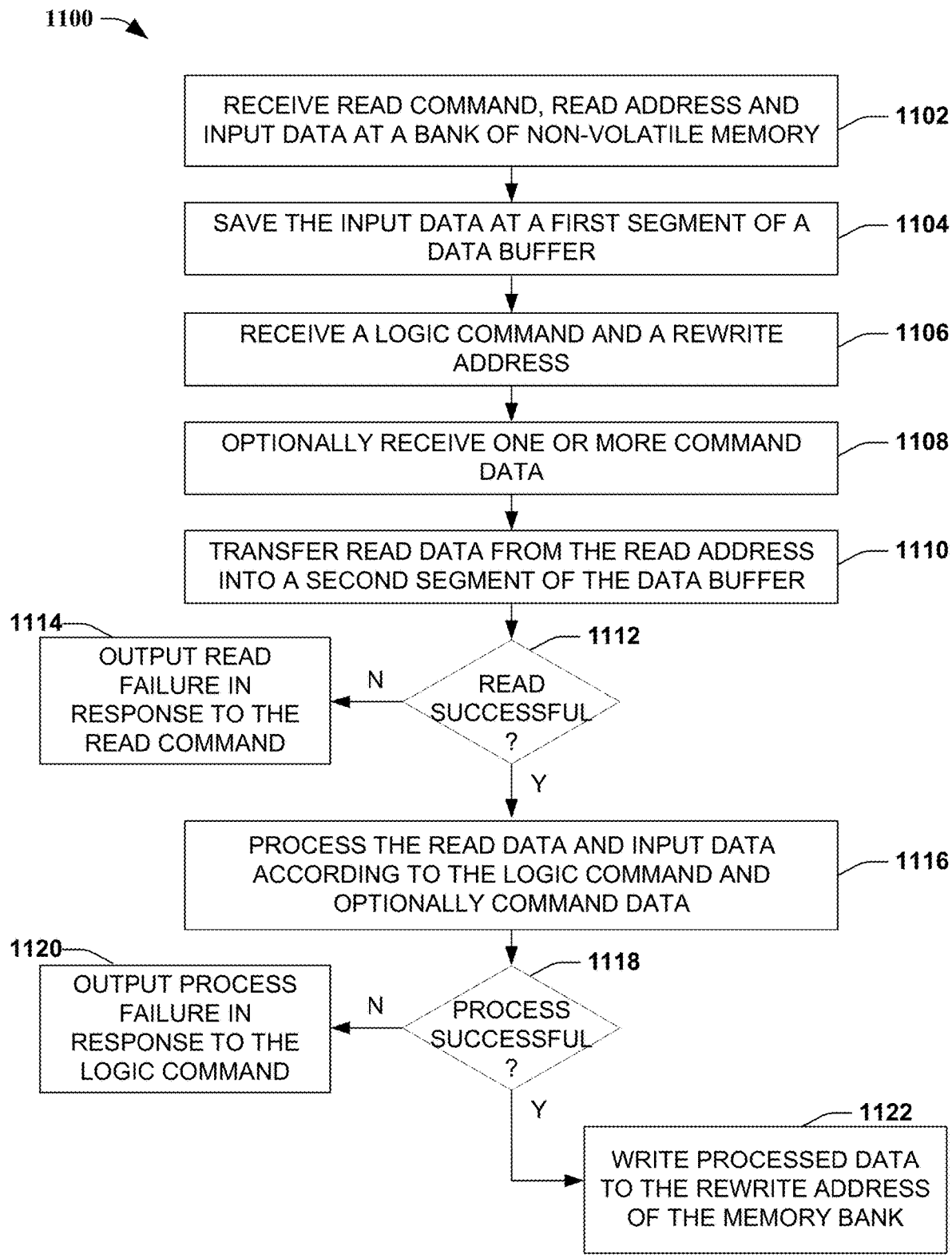
FIG. 11 depicts a flowchart of an example method for processing stored data and rewriting processed data in an alternative embodiment(s)

FIG. 11 depicts a flowchart of a sample method 1100 for operating a memory bank of a non-volatile memory device according to yet additional embodiments. At 1102, method 1100 can comprise receiving a read command, a read address and input data at an input interface of the memory bank. At 1104, method 1100 can comprise saving the input data at a first segment of a data buffer. At 1106, method 1100 can comprise receiving a logic command pertaining to the read command, read address and input data, and a rewrite address for writing processed data. The logic command can reference a logic or mathematical operation that the memory device is programmed to identify, and configured to implement utilizing processing hardware or software. At 1108, method 1100 can comprise optionally receiving command data pertaining to the logic command in conjunction with the logic command. The command data can include a logic/mathematical argument, a logic/mathematical filter, a logic/mathematical operator, a logic/mathematical algorithm, a logic/mathematical parameter, a query criterion (criteria), data to be operated upon, or the like, or a suitable combination thereof. At 1110, method 1100 can comprise transferring read data from the read address into a second segment of the data buffer. At 1112, method 1100 can determine whether the transferring read data to the second segment of the data buffer is successful, and if successful method 1100 can proceed to 1116. Otherwise, method 1100 can proceed to 1114 and can comprise outputting a read failure in response to the read command.

At 1116, method 1100 can comprise processing the read data from the second segment of the data buffer and the input data from the first segment of the data buffer according to the logic command and optionally according to the command data. At 1118, method 1100 can determine whether the processing is successful. In not successful, method 1100 can proceed to 1120 and output a process failure in response to the read command and the logic command. If successful, method 1100 can proceed to 1122 and write processed data to the rewrite address in response to the read command and the logic command.

Figure 12:
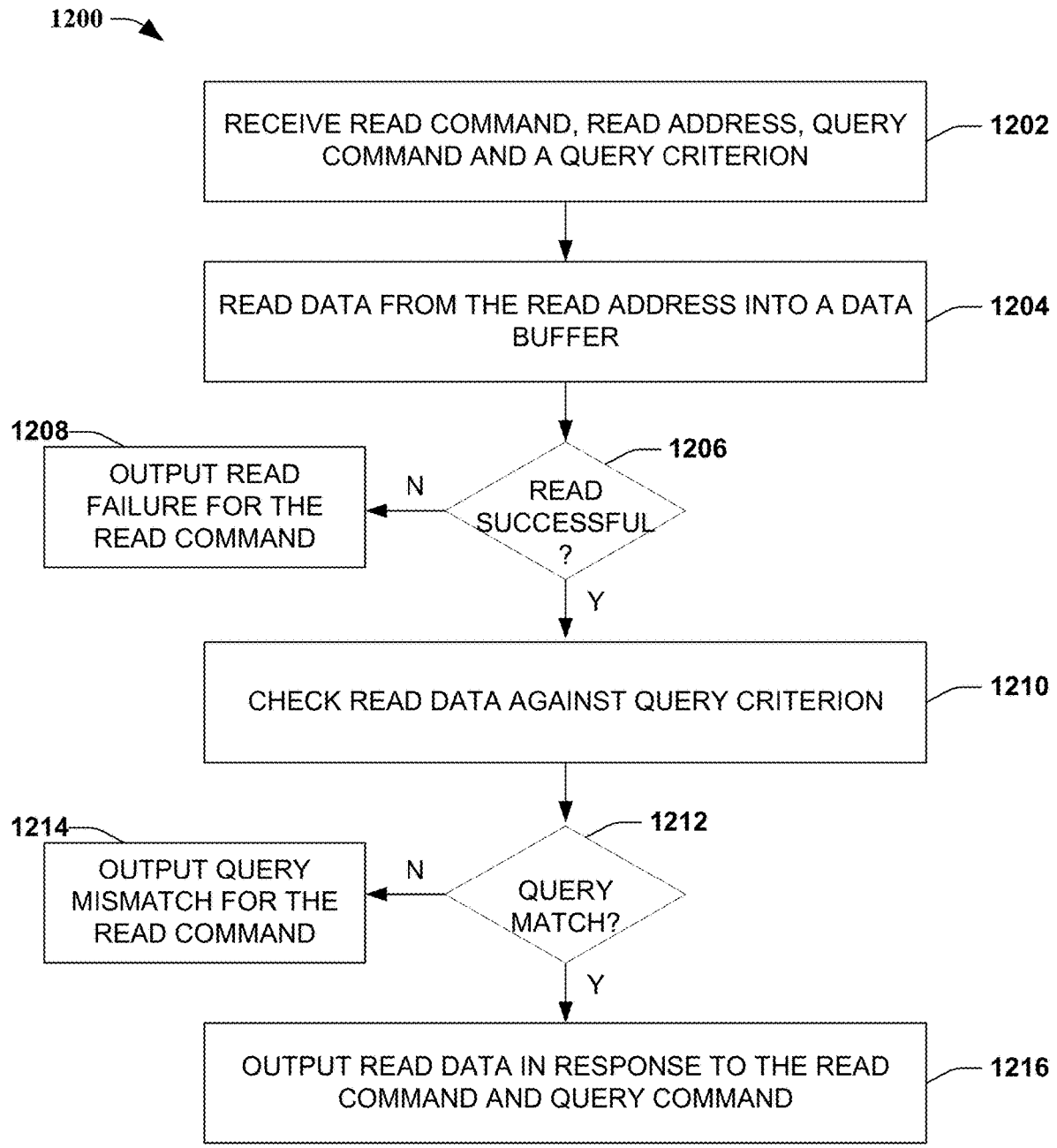
FIG. 12 illustrates a flowchart of a sample method for reading data that satisfies a query condition, in an embodiment.

FIG. 12 depicts a flowchart of an example method 1200 for operating a memory bank of a non-volatile memory in one or more additional embodiments of the present disclosure. At 1202, method 1200 can comprise receiving a read command, a read address, a query command and a query criterion. In at least one embodiment, the query command is a non-limiting example of a disclosed logic command, and the query criterion is a non-limiting example of disclosed command data. At 1204, method 1200 can comprise reading data from the read address into a data buffer. At 1210, method 1200 can determine whether the read was successful, and proceed to 1206 if so. If unsuccessful, method 1200 can proceed to 1208 and output a read failure in response to the read command and query command. At 1210, method 1200 can comprise checking read data against the query criterion in conjunction with satisfying the query command. At 1212, method 1200 can determine whether the read data is a query match. If a match, method 1200 can proceed to 1216 where method 1200 can comprise outputting the read data in response to the read command and the query command. Otherwise, if not a match, method 1200 can proceed to 1214 and comprise outputting a query mismatch for the read command and query command.

Figure 13:
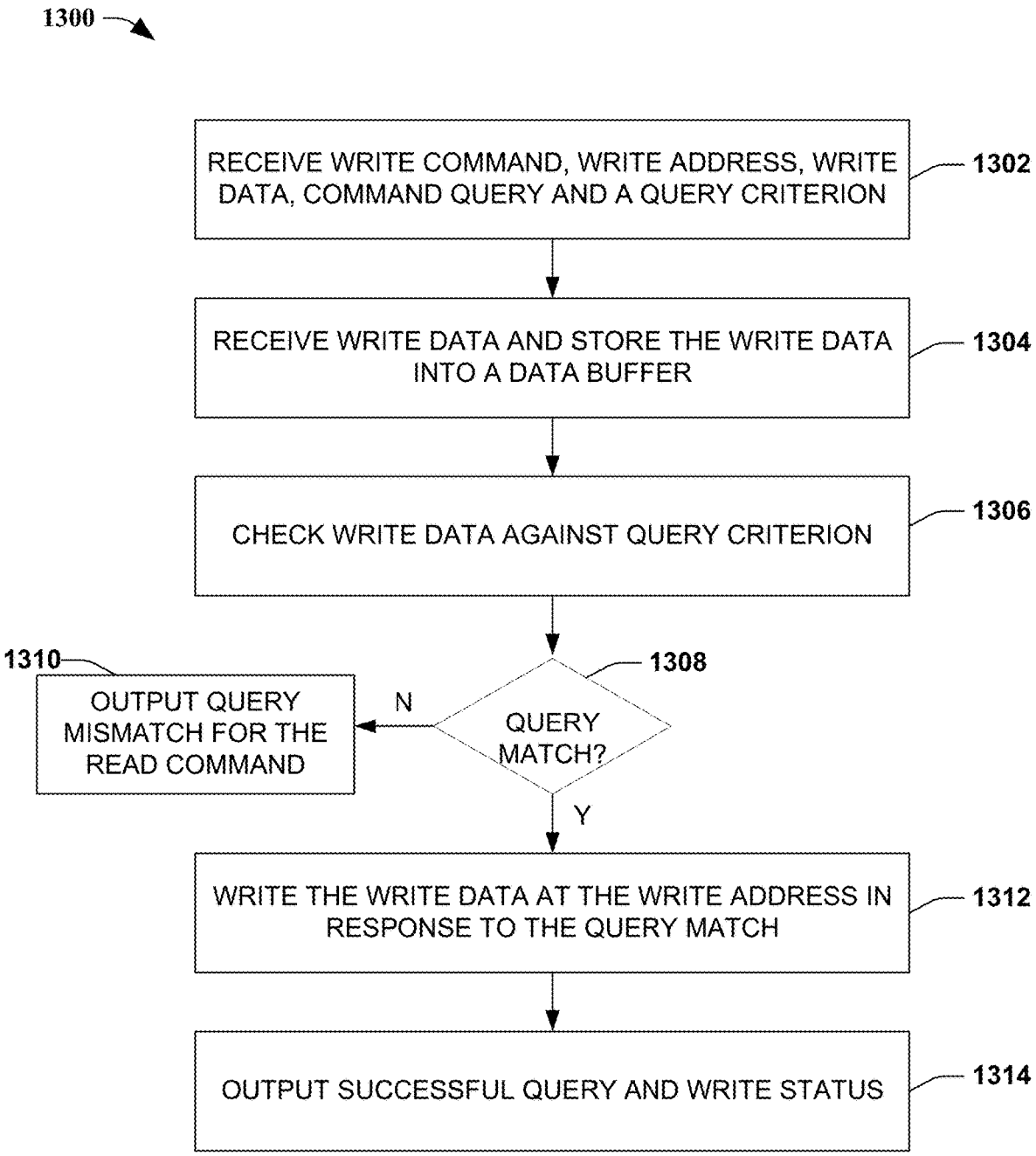
FIG. 13 depicts a flowchart of a sample method for writing data that successfully satisfies a query condition, in a further embodiment.

FIG. 13 depicts a flowchart of an example method 1300 for operating a memory bank of a non-volatile memory in still further embodiments of the present disclosure. At 1302, method 1300 can comprise receiving a write command, a write address, a query command and a query criterion. In at least one embodiment, the query command is a non-limiting example of a disclosed logic command, and the query criterion is a non-limiting example of disclosed command data. At 1304, method 1300 can comprise receiving write data and saving the write data to a data buffer. At 1306, method 1300 can comprise checking the write data against the query criterion in conjunction with executing the query command. At 1308, method 1300 can determine whether a query match results. If no query match, method 1300 can proceed to 1310 and can comprise outputting a query mismatch in response to the read command and query command. If a query match, method 1300 can instead proceed to 1312 and can comprise writing the write data to the write address in response to the query match. At 1314, method 1300 can comprise outputting successful query and write status.

Figure 14:
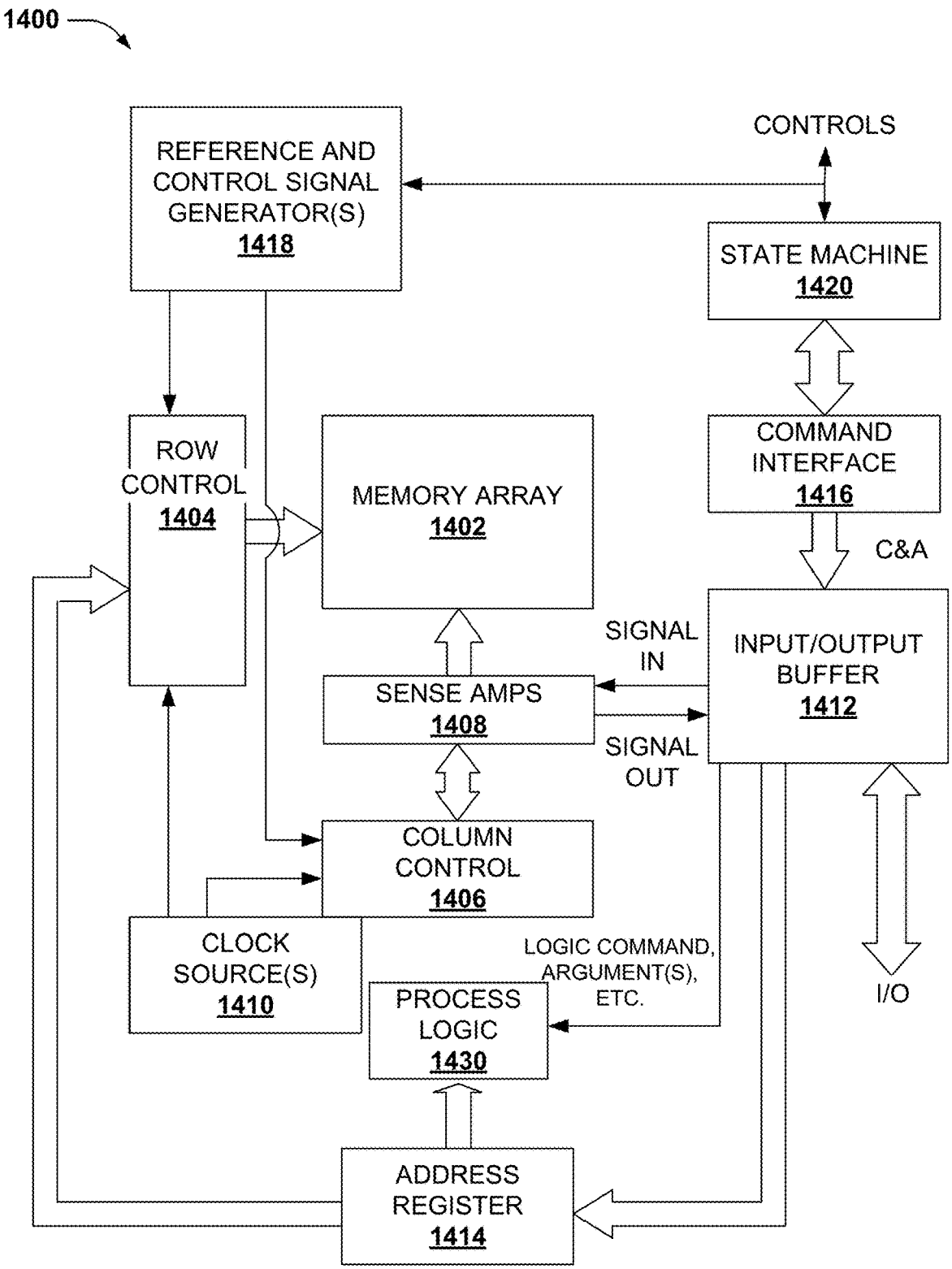
FIG. 14 illustrates a block diagram of an example memory architecture with inline process logic according to still further embodiments of the present disclosure.

In order to provide a context for the various aspects of the disclosed subject matter, FIG. 14, as well as the following discussion, is intended to provide a brief, general description of a suitable environment in which various aspects of the disclosed subject matter can be implemented or processed. While the subject matter has been described above in the general context of electronic memory or architectures and process methodologies for operating such memory or architectures, those skilled in the art will recognize that the subject disclosure also can be implemented in combination with other architectures or process methodologies. Moreover, those skilled in the art will appreciate that the disclosed processes can be practiced with a processing system or a computer processor, either alone or in conjunction with a host computer (e.g., computer 1502 of FIG. 15, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 14 illustrates a block diagram of an example operating and control environment 1400 for a memory bank 1402 of a memory device in one or more disclosed embodiments. In one or more embodiments, memory bank 1402 can be one of a plurality of memory banks of a multi-bank memory device. In at least one aspect of the subject disclosure, memory bank 1402 can comprise memory selected from a variety of memory cell technologies. In at least one embodiment, memory bank 1402 can comprise a two-terminal memory technology, arranged in a compact two or three dimensional architecture. Suitable two-terminal memory technologies can include resistive-switching memory, conductive-bridging memory, phase-change memory, organic memory, magneto-resistive memory, or the like, or a suitable combination of the foregoing. In yet another embodiment, memory bank 1402 can be configured to operate according to a first set of configurations (e.g., MLC, SLC, operation voltage, clock speed, latency, etc.) that is at least in part different from a second set of configurations of a second memory bank of the multi-bank memory device.

A column controller 1406 and sense amps 1408 can be formed adjacent to memory bank 1402. Moreover, column controller 1406 can be configured to activate (or identify for activation) a subset of bitlines of memory bank 1402. Column controller 1406 can utilize a control signal provided by a reference and control signal generator(s) 1418 to activate, as well as operate upon, respective ones of the subset of bitlines, applying suitable program, erase or read voltages to those bitlines. Non-activated bitlines can be kept at an inhibit voltage (also applied by reference and control signal generator(s) 1418), to mitigate or avoid bit-disturb effects on these non-activated bitlines.

In addition, operating and control environment 1400 can comprise a row controller 1404. Row controller 1404 can be formed adjacent to and electrically connected with word lines of memory bank 1402. Further, utilizing control signals of reference and control signal generator(s) 1418, row controller 1404 can select particular rows of memory cells with a suitable selection voltage. Moreover, row controller 1404 can facilitate program, erase or read operations by applying suitable voltages at selected word lines.

Sense amps 1408 can read data from, or write data to the activated memory cells of memory bank 1402, which are selected by column control 1406 and row control 1404. Data read out from memory bank 1402 can be provided to an input and input/output buffer 1412 (e.g., comprising a data buffer and command buffer, in some embodiments). Likewise, data to be written to memory bank 1402 can be received from the input and input/output buffer 1412 and written to the activated memory cells of memory bank 1402.

Process logic 1430 can be provided to implement logic or mathematical operations. A logic command received at input/output buffer 1412 can be provided to process logic 1430 to implement a logic or math operation (e.g., according to pre-stored instructions, according to configured logic circuitry, or the like). Command data such as a command argument, filter, operator, algorithm, parameter, query, input data, etc., pertaining to the logic or math operation can also be received at input/output buffer 1412. The logic or math operation can be implemented on data saved at input/output buffer 1412, whether data having been read from memory bank 1402 or data provided by a host to be processed and written into memory bank 1402, or a suitable combination thereof. Process logic 1430 can additionally output a success or failure result of the logic or math operation, in some embodiments, separate from the success or failure of a memory operation (e.g., read operation, write operation, erase operation, etc.).

A clock source(s) 1410 can provide respective clock pulses to facilitate timing for read, write, and program operations of row controller 1404 and column controller 1406. Clock source(s) 1410 can further facilitate selection of wordlines or bitlines in response to external or internal commands received by operating and control environment 1400. Input and input/output buffer 1412 can comprise a command and address input, as well as a bidirectional data input and output. Instructions are provided over the command and address input, and the data to be written to memory bank 1402 as well as data read from memory bank 1402 is conveyed on the bidirectional data input and output, facilitating connection to an external host apparatus, such as a computer or other processing device (not depicted, but see e.g., computer 1002 of FIG. 10, infra).

Input and input/output buffer 1412 can be configured to receive write data, receive an erase instruction, receive a status or maintenance instruction, output readout data, output status information, and receive address data and command data, as well as address data for respective instructions. Address data can be transferred to row controller 1404 and column controller 1406 by an address register 1410. In addition, input data is transmitted to memory bank 1402 via signal input lines between sense amps 1408 and input and input/output buffer 1412, and output data is received from memory bank 1402 via signal output lines from sense amps 1408 to input and input/output buffer 1412. Input data can be received from the host apparatus, and output data can be delivered to the host apparatus via the I/O bus.

Commands received from the host apparatus can be provided to a command interface 1416. Command interface 1416 can be configured to receive external control signals from the host apparatus, and determine whether data input to the input and input/output buffer 1412 is write data, a command, or an address. Input commands can be transferred to a state machine 1420.

State machine 1420 can be configured to manage programming and reprogramming of memory bank 1402 (as well as other memory banks of the multi-bank memory array). Instructions provided to state machine 1420 are implemented according to control logic configurations, enabling state machine 1420 to manage read, write, erase, data input, data output, and other functionality associated with memory bank 1402. In some aspects, state machine 1420 can send and receive acknowledgments and negative acknowledgments regarding successful receipt or execution of various commands. In further embodiments, state machine 1420 can decode and implement status-related commands, decode and implement configuration commands, and so on.

To implement read, write, erase, input, output, etc., functionality, state machine 1420 can control clock source(s) 1408 or reference and control signal generator(s) 1418. Control of clock source(s) 1408 can cause output pulses configured to facilitate row controller 1404 and column controller 1406 implementing the particular functionality. Output pulses can be transferred to selected bitlines by column controller 1406, for instance, or wordlines by row controller 1404, for instance.

In connection with FIG. 15, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 15:
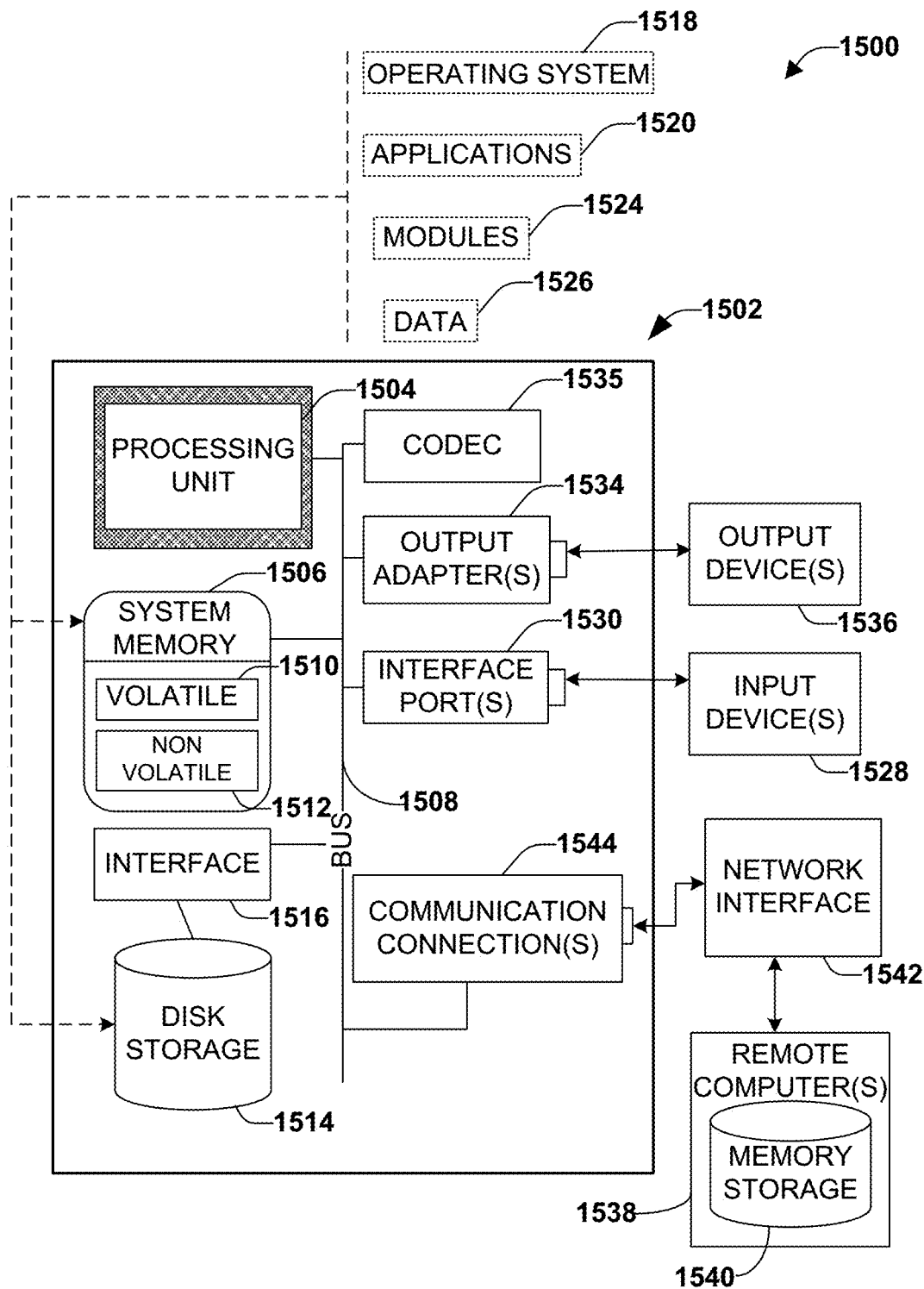
FIG. 15 depicts a block diagram of an example computing environment that can be implemented in conjunction with various disclosed embodiments.

With reference to FIG. 15, a suitable operating environment 1500 for implementing various aspects of the claimed subject matter includes a computer 1502. The computer 1502 includes a processing unit 1504, a system memory 1506, a codec 1535, and a system bus 1508. The system bus 1508 couples system components including, but not limited to, the system memory 1506 to the processing unit 1504. The processing unit 1504 can be any of various available processors. Dual microprocessors and other multiprocessor architectures also can be employed as the processing unit 1504.

The system bus 1508 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), and Small Computer Systems Interface (SCSI).

The system memory 1506 includes volatile memory 1510 and non-volatile memory 1514, which can employ one or more of the disclosed memory architectures, in various embodiments. The basic input/output system (BIOS), containing the basic routines to transfer information between elements within the computer 1502, such as during start-up, is stored in non-volatile memory 1512. In addition, according to present innovations, codec 1535 may include at least one of an encoder or decoder, wherein the at least one of an encoder or decoder may consist of hardware, software, or a combination of hardware and software. Although, codec 1535 is depicted as a separate component, codec 1535 may be contained within non-volatile memory 1512. By way of illustration, and not limitation, non-volatile memory 1512 can include read only memory (ROM), programmable ROM (PROM), electrically programmable ROM (EPROM), electrically erasable programmable ROM (EEPROM), or Flash memory. Non-volatile memory 1512 can employ one or more of the disclosed memory architectures, in at least some disclosed embodiments. Moreover, non-volatile memory 1512 can be computer memory (e.g., physically integrated with computer 1502 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1510 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1502 may also include removable/non-removable, volatile/non-volatile computer storage medium. FIG. 15 illustrates, for example, disk storage 1514. Disk storage 1514 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1514 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1514 to the system bus 1508, a removable or non-removable interface is typically used, such as interface 1516. It is appreciated that disk storage 1514 can store information related to a user. Such information might be stored at or provided to a server or to an application running on a user device. In one embodiment, the user can be notified (e.g., by way of output device(s) 1536) of the types of information that are stored to disk storage 1514 and/or transmitted to the server or application. The user can be provided the opportunity to opt-in or opt-out of having such information collected and/or shared with the server or application (e.g., by way of input from input device(s) 1528).

It is to be appreciated that FIG. 15 describes software that acts as an intermediary between users and the basic computer resources described in the suitable operating environment 1500. Such software includes an operating system 1518. Operating system 1518, which can be stored on disk storage 1514, acts to control and allocate resources of the computer 1502. Applications 1520 take advantage of the management of resources by operating system 1518 through program modules 1524, and program data 1526, such as the boot/shutdown transaction table and the like, stored either in system memory 1506 or on disk storage 1514. It is to be appreciated that the claimed subject matter can be implemented with various operating systems or combinations of operating systems.

A user enters commands or information into the computer 1502 through input device(s) 1528. Input devices 1528 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1504 through the system bus 1508 via interface port(s) 1530. Interface port(s) 1530 include, for example, a serial port, a parallel port, a game port, and a universal serial bus (USB). Output device(s) 1536 use some of the same type of ports as input device(s) 1528. Thus, for example, a USB port may be used to provide input to computer 1502 and to output information from computer 1502 to an output device 1536. Output adapter 1534 is provided to illustrate that there are some output devices, such as monitors, speakers, and printers, among other output devices, which require special adapters. The output adapter 1534 can include, by way of illustration and not limitation, video and sound cards that provide a means of connection between the output device 1536 and the system bus 1508. It should be noted that other devices and/or systems of devices provide both input and output capabilities such as remote computer(s) 1538.

Computer 1502 can operate in a networked environment using logical connections to one or more remote computers, such as remote computer(s) 1538. The remote computer(s) 1538 can be a personal computer, a server, a router, a network PC, a workstation, a microprocessor based appliance, a peer device, a smart phone, a tablet, or other network node, and typically includes many of the elements described relative to computer 1502. For purposes of brevity, only a memory storage device 1540 is illustrated with remote computer(s) 1538. Remote computer(s) 1538 is logically connected to computer 1502 through a network interface 1542 and then connected via communication connection(s) 1544. Network interface 1542 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1544 refers to the hardware/software employed to connect the network interface 1542 to the system bus 1508. While communication connection 1544 is shown for illustrative clarity inside computer 1502, it can also be external to computer 1502. The hardware/software necessary for connection to the network interface 1542 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter.

The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A non-volatile memory device, comprising:
   a memory bank of non-volatile storage memory;
   sense amps configured to read data stored in a selected subset of the memory bank;
   a data buffer configured to receive input data over a data interface or to provide output data over the data interface;
   a command interface for receiving from a host device a memory command specifying a memory operation and a data command separate from the memory command; and
   a processing logic unit configured to execute the data command in conjunction with the memory bank performing the memory operation related to acquiring read data from the non-volatile storage memory or storing write data to the non-volatile storage memory, wherein at least one of:
   the processing logic unit operates upon the read data to produce first processed data in response to the data command after the read data is read by the sense amps and received into the data buffer, or
   the processing logic unit operates upon the write data to produce second processed data in response to the data command after the write data is received from the data interface into the data buffer.

2. The non-volatile memory device of claim 1, wherein the memory operation is a read command, a write command or an erase command, and wherein the data command is none of the read command, the write command or the erase command.

3. The non-volatile memory device of claim 1, wherein the command interface is further configured for receiving an argument pertaining to the data command.

4. The non-volatile memory device of claim 3, wherein the data command is a conditional read command and the argument is a read filter, and further wherein the data buffer outputs the processed data in conjunction with executing the conditional read only in response to determining that the read data matches the read filter.

5. The non-volatile memory device of claim 1, wherein the processing logic unit includes logic circuitry for executing a logic algorithm.

6. The non-volatile memory device of claim 5, wherein the data command is an instruction to execute the logic algorithm and the processing logic unit executes the logic algorithm on the read data or the write data to produce the processed data.

7. The non-volatile memory device of claim 6, wherein the logic algorithm is selected from a group consisting of: an AND operation, an OR operation, and a XOR operation.

8. The non-volatile memory device of claim 1, wherein:
the data command is an operational rewrite command specifying a logic operation;
an argument received with the data command via the command interface includes a source address, a destination address and an optional command argument; and
the processing logic unit, in conjunction with execution of the operational rewrite performs operations including:
activating the source address within the memory bank;
transferring data stored at the source address into the data buffer as the read data;
executing the logic operation on the read data—optionally according to the optional command argument—producing the first processed data; and
writing the first processed data to the destination address.

9. The non-volatile memory device of claim 1, wherein:
the processing logic unit further comprises stored status protocols causing the processing logic unit to output a status of execution of the memory command or of the data command; and
the status protocols instruct the processing logic unit to output a read or write failure in response to a first failure by the memory bank to execute the memory operation, and wherein the status protocols instruct the processing logic unit to output a data command failure in response to a second failure by the processing logic unit to execute the data command.

10. A method of operating a memory device, comprising:
receiving write data and a write address at a data buffer of a memory bank of non-volatile memory;
receiving a data command pertaining to the write data wherein the data command is inputted from a host device;
processing the write data according to the data command;
producing processed data in response to successful execution of the data command, wherein the processed data is different from the write data; and
writing the processed data to the write address of the memory bank in response to successful execution of the data command.

11. The method of claim 10, further comprising outputting a data error in response to a failure to successfully execute the data command and produce the processed data.

12. The method of claim 10, further comprising outputting a write error in response to a failure by the memory device to write the processed data to the write address of the memory bank.

13. The method of claim 10, further comprising outputting a command success in response to the successful execution of the data command and in response to writing the processed data to the write address of the memory bank.

14. The method of claim 10, further comprising receiving a command argument in addition to the data command.

15. The method of claim 14, wherein processing the write data according to the data command further includes incorporating the command argument.

16. A method of operating a memory device, comprising:
receiving a read command and read address at a memory bank of non-volatile memory;
receiving a data command pertaining to data stored at the read address wherein the data command is inputted from a host device;
transferring read data from the read address into a data buffer;
producing processed data in response to successful execution of the data command, wherein the processed data is different from the read data; and
outputting the processed data to a host device in response to successful execution of the data command.

17. The method of claim 16, further comprising outputting a data error in response to a failure to successfully execute the data command and produce the processed data.

18. The method of claim 16, further comprising outputting a read error in response to a failure to transfer the read data from the read address to the data buffer.

19. The method of claim 16, further comprising receiving a command argument in addition to the data command.

20. The method of claim 19, wherein processing the read data according to the data command further includes incorporating the command argument.

* * * * *